United States Patent [19]
Noguchi et al.

[11] Patent Number: 6,064,700
[45] Date of Patent: May 16, 2000

[54] 1-BIT DIGITAL SIGNAL PROCESSING DEVICE, RECORDING DEVICE, AND REPRODUCING DEVICE

[75] Inventors: Masayoshi Noguchi, Chiba; Gen Ichimura, Tokyo, both of Japan

[73] Assignee: Sony Corporation, Tokyo, Japan

[21] Appl. No.: 08/895,996

[22] Filed: Jul. 17, 1997

[30] Foreign Application Priority Data

Jul. 26, 1996 [JP] Japan ................................. 8-197545

[51] Int. Cl.⁷ .................................................. H04B 14/06
[52] U.S. Cl. .......................................... 375/247; 341/141
[58] Field of Search ............................. 341/141; 375/247

[56] References Cited

U.S. PATENT DOCUMENTS

| | | |
|---|---|---|
| 5,225,787 | 7/1993 | Therssen ..................................... 328/15 |
| 5,497,152 | 3/1996 | Wilson et al. .............................. 341/61 |
| 5,712,838 | 1/1998 | Inazawa et al. ........................... 369/59 |
| 5,793,316 | 8/1998 | Noguchi et al. ........................... 341/77 |
| 5,916,301 | 6/1999 | Rothacher ................................. 708/312 |

FOREIGN PATENT DOCUMENTS

| | | | |
|---|---|---|---|
| 4129311 | 4/1992 | European Pat. Off. ......... H03G 3/34 |
| 0665546 | 8/1995 | European Pat. Off. ........ G11B 20/10 |
| 8018518 | 1/1996 | European Pat. Off. ........ H04B 14/04 |

Primary Examiner—Stephen Chin
Assistant Examiner—Paul N Rupert
Attorney, Agent, or Firm—Jay H. Maioli

[57] ABSTRACT

A switching device for switching between a 1-bit digital signal $\Sigma\Delta$ modulated by a first sampling frequency and a 1-bit digital signal $\Sigma\Delta$ modulated by a second sampling frequency lower than the first sampling frequency. The 1-bit digital signal $\Sigma\Delta$ modulated by the second sampling frequency is transiently converted to the 1-bit digital signal $\Sigma\Delta$ modulated by the first sampling frequency. The converted 1-bit digital signal or the 1-bit digital signal $\Sigma\Delta$ modulated by the first sampling frequency is switched by cross-fading processing for realizing switching with suppressed noise generation at the time of switching.

10 Claims, 22 Drawing Sheets

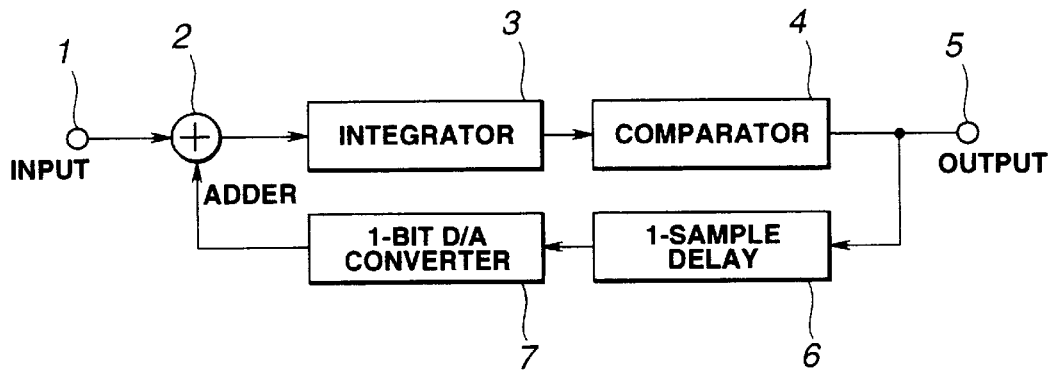
FIG.2
(PRIOR ART)
FIG.3A 32×fs/ 1-BIT INPUT AUDIO SIGNAL $S_B$
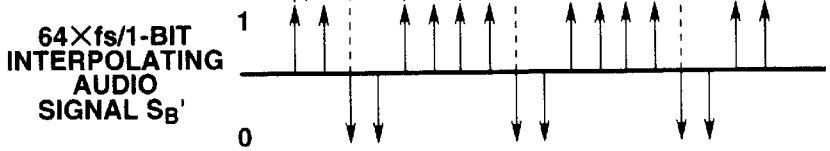
FIG.3B 64×fs/1-BIT INTERPOLATING AUDIO SIGNAL $S_B'$

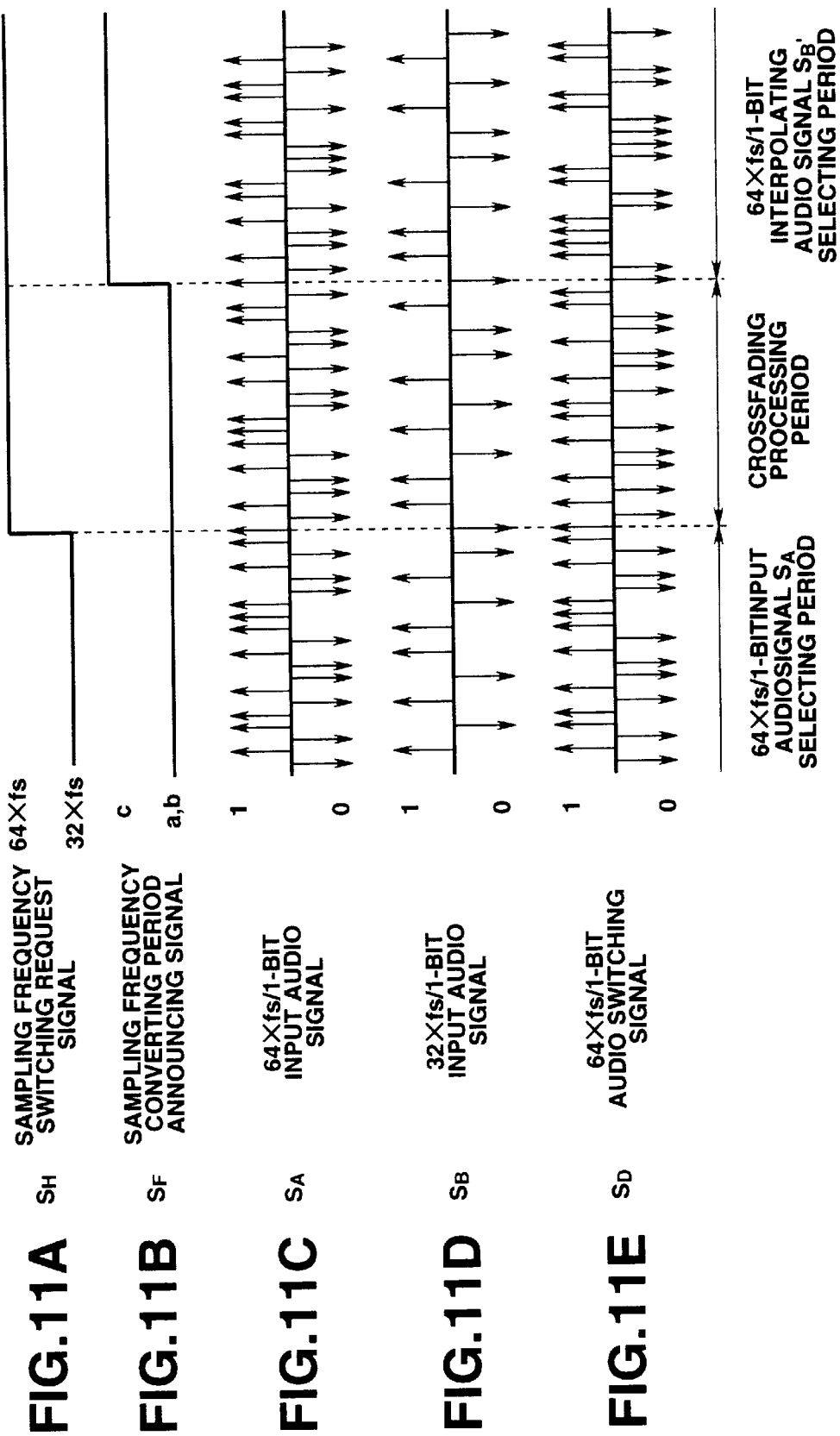

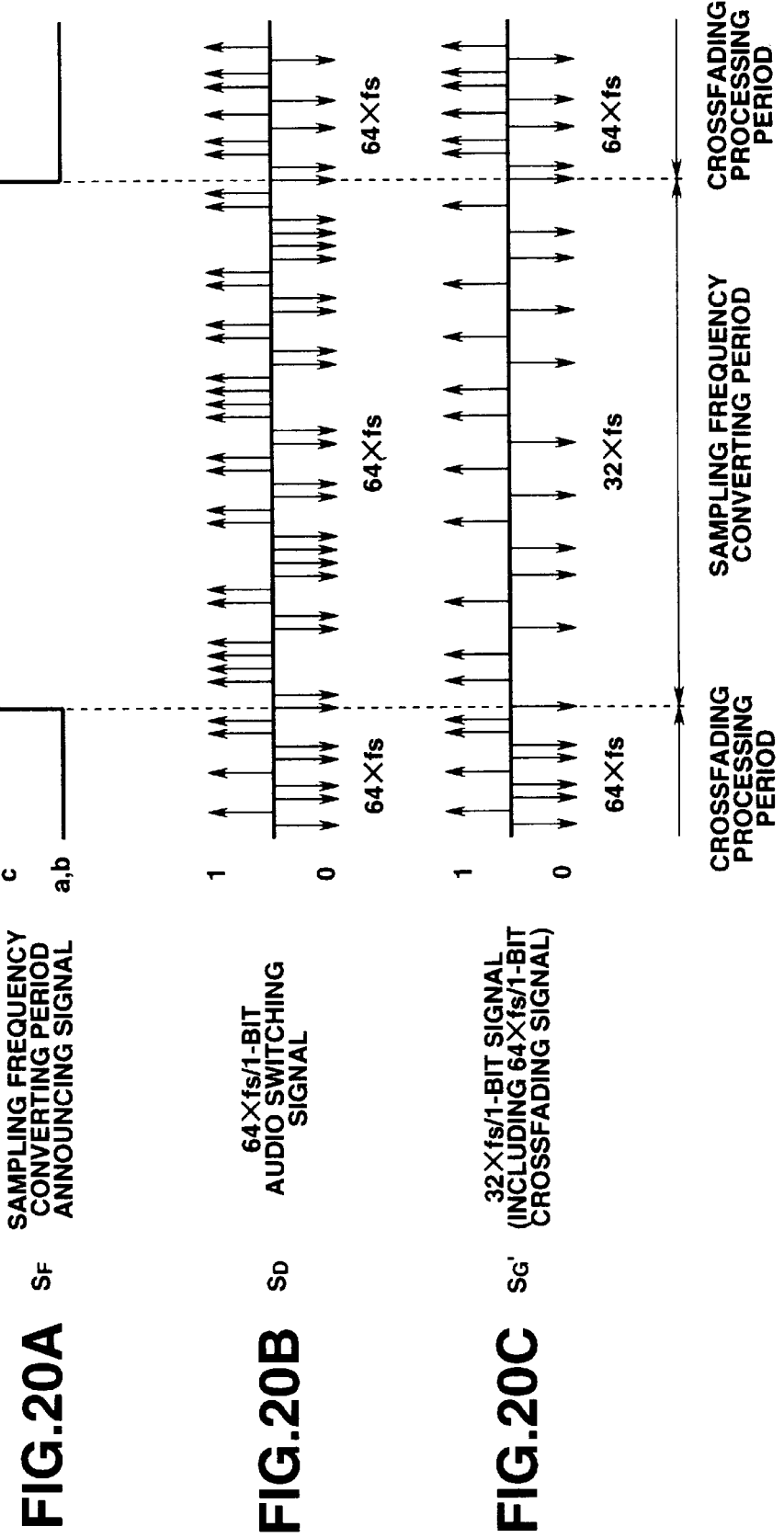

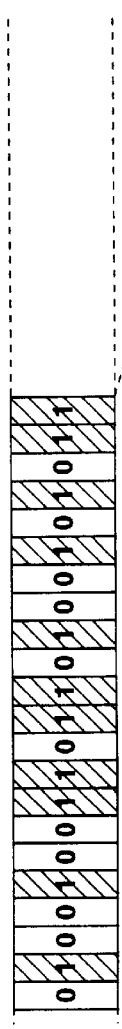

1-BIT DIGITAL SIGNAL PROCESSING DEVICE, RECORDING DEVICE, AND REPRODUCING DEVICE

BACKGROUND OF THE INVENTION

1. Field of the Invention

This invention relates to a digital signal processing device for switching and outputting a 1-bit digital signal obtained on sigma-delta modulation, a recording device for recording the 1-bit signal and a reproducing device for reproducing the 1-bit digital signal.

2. Description of the Related Art

The high-speed 1-bit signal, obtained on sigma-delta ($\Sigma\Delta$) modulation, has an extremely high sampling frequency and a short word length, such as a sampling frequency equal to 64 times 44.1 kHz and a word length of 1 bit, as compared to a so-called multi-bit digital signal with the sampling frequency of 44.1 kHz and a data word length of 16 bits, used in the conventional digital audio, and is characterized by a broad transmission frequency range. In addition, the high-speed 1-bit signal has a dynamic range sufficiently higher than the conventional audio range of 20 kHz with the sampling frequency of 44.1 kHz×64=2.8224 MHz. By exploiting these properties, the 1-bit signal can be used for a recorder with a high sound quality or data transmission.

The circuit employing the $\Sigma\Delta$ modulation itself is not a new technique and has so far been used every so often in an A/D converter because the circuit structure can be easily built into an IC and high precision can be realized relatively easily. The $\Sigma\Delta$ modulated signal can be passed through a simple analog low-pass filter for re-conversion to analog audio signals.

Meanwhile, the above-described high-quality 1-bit audio signals tend to be increased in data capacity as compared to the conventional multi-bit system. For saving the data capacity, a 1-bit audio signal with a lower sampling frequency may be used. However, in this case, the signal quality is inevitably lowered. It is therefore contemplated to switch between a 1-bit audio signal with a high sampling frequency and a 1-bit audio signal with a low sampling frequency in the same device from one media to another and from one quality that is optionally required in a given media to another, and to record the selected 1-bit audio signal.

Meanwhile, since the 1-bit audio signal is a signal modulated on the time axis, if the 1-bit digital signals of two different routes and with different sampling frequencies are switched directly, a large noise is produced at the switching point.

SUMMARY OF THE INVENTION

It is therefore an object of the present invention to provide a digital signal recording device whereby 1-bit digital signals of two routes recorded on the same recording medium and which have been $\Sigma\Delta$ modulated with different sampling frequencies, can be switched in a noise-free manner.

It is another object of the present invention to provide a digital signal recording device whereby 1-bit digital signals of two routes recorded on the same recording medium and which have been $\Sigma\Delta$ modulated with different sampling frequencies can be recorded while suppressing consumption of the recording medium.

It is yet another object of the present invention to provide a digital signal reproducing device whereby 1-bit digital signals of two routes recorded on the same recording medium and which have been $\Sigma\Delta$ modulated with different sampling frequencies can be reproduced while realizing smooth switching between 1-bit digital signals of two routes recorded on the same recording medium and which have been $\Sigma\Delta$ modulated with different sampling frequencies.

In one aspect, the present invention provides a digital signal processing device for switching between a first 1-bit digital signal sampled at a first sampling frequency and a second 1-bit digital signal sampled at a second sampling frequency lower than the first sampling frequency. The digital signal processing device includes conversion means for converting a second 1-bit digital signal sampled by the second sampling frequency into a third 1-bit digital signal sampled at a first sampling frequency, switching means for switching between the third 1-bit digital signal outputted by the conversion means and the first 1-bit digital signal and output means for outputting the 1-bit digital signal sampled at the first sampling frequency from the switching means.

In another aspect, the present invention provides a digital signal processing device for switching between a first 1-bit digital signal sampled at a first sampling frequency and a second 1-bit digital signal sampled at a second sampling frequency lower than the first sampling frequency, at a pre-set timing. The digital signal processing device has conversion means for converting a second 1-bit digital signal sampled by the second sampling frequency into a third 1-bit digital signal sampled at a first sampling frequency, first bit length conversion means for converting the first 1-bit digital signal into a multi-bit digital signal, second bit length conversion means for converting the third 1-bit digital signal into a multi-bit digital signal, first amplitude control means for amplitude controlling the multi-bit digital signal converted by the first bit length conversion means, second amplitude control means for amplitude controlling the multi-bit digital signal converted by the second bit length conversion means, summing means for summing the multi-bit digital signal controlled in the amplitude direction by the first amplitude control means and the multi-bit digital signal controlled in the amplitude direction by the second amplitude control means, re-quantization means for re-sampling the multi-bit digital signal outputted by the summation means with the first sampling frequency, pattern coincidence detection means for detecting the pattern coincidence between the 1-bit digital signal quantized by the re-quantization means and the first 1-bit digital signal or the pattern coincidence between the 1-bit digital signal quantized by the re-quantization means and the third 1-bit digital signal and switching means for switching between the first 1-bit digital signal, third 1-bit digital signal and the 1-bit digital signal quantized by the re-quantization means at a pre-set timing based on the results of detection by the pattern coincidence detection means.

In still another aspect, the present invention provides a digital signal recording device for recording a 1-bit digital signal on a recording medium, the 1-bit digital signal being a first 1-bit digital signal sampled at a first sampling frequency or a third 1-bit digital signal obtained on interpolating, by the first sampling frequency, a second 1-bit digital signal sampled by a second sampling frequency lower than the first sampling frequency, with the first 1-bit digital signal or the third 1-bit digital signal being switched at a pre-set timing for transmission. The digital signal recording device has detection means for detecting the third 1-bit digital signal, decimating means decimating the third 1-bit digital signal during the time the third 1-bit digital signal is detected by the detection means and recording means for recording the data of the modulator on the recording medium, with the third 1-bit digital signal being entered via the decimating means and with the first 1-bit digital signal being entered to the modulator without interposition of the decimating means.

In yet another aspect, the present invention provides a digital signal reproducing device for reproducing a recording medium having recorded thereon a first 1-bit digital signal sampled at a first sampling frequency and a second 1-bit digital signal sampled at a second sampling frequency lower than the first sampling frequency, demodulation means for demodulating the digital signal reproduced from the recording medium, extraction means for extracting the second 1-bit digital signal sampled at the second sampling frequency from the digital signal reproduced from the recording medium, pre-value holding the second 1-bit digital signal extracted by the extraction means based on the first sampling frequency for conversion to a third 1-bit digital signal of the first sampling frequency and output means for outputting the first 1-bit digital signal without interposition of the conversion means and converting the second 1-bit digital signal and outputting the converted signal.

With the digital signal processing device according to the present invention, since the low rate channel input 1-bit digital signal is interpolated by interpolation means to output an interpolated 1-bit digital signal of a high rate channel equal to an integer n times the low rate, and cross-fading processing means is used for switching between the high rate channel interpolated 1-bit digital signal and the high rate channel input 1-bit digital signal, it becomes possible to realize low-noise switching of two routes of 1-bit digital signals ΣΔ modulated with different sampling frequencies.

Also, with the digital signal recording device according to the present invention, since the interpolated high rate channel 1-bit digital signal having an integer n times the low rate obtained on interpolating the low-rate channel input 1-bit digital signal is decimated by a factor of 1/n by decimation means and the low-rate channel input 1-bit digital signal from the decimation means or the high rate channel 1-bit digital signal is recorded by recording means on a recording medium, two routes of the 1-bit digital signals ΣΔ modulated with different sampling frequencies can be recorded in such a manner as to suppress consumption of the recording medium.

Likewise, with the digital signal reproducing device according to the present invention, since the low-rate channel 1-bit digital signal and the high rate channel 1-bit digital signal having a rate equal to an integer number n times the above low rate are reproduced by reproducing means, and the low-rate channel 1-bit digital signal of the multi-rate 1-bit digital signals is interpolated by interpolation means, two routes of the 1-bit digital signals ΣΔ modulated with different sampling frequencies can be reproduced with smooth switching between the two routes of the signals.

BRIEF DESCRIPTION OF THE DRAWINGS

FIG. 2 is a block diagram of a ΣΔ modulator for generating 1-bit digital signals.

FIG. 3A is a timing chart showing a 1-bit digital signal SB sampled with a low sampling frequency.

FIG. 3B is a timing chart showing conversion of the 1-bit digital signal SB sampled with a low sampling frequency into a 1-bit digital signal SB' sampled with a high sampling frequency.

FIG. 11A is a timing chart showing a sampling frequency switching request signal SH.

FIG. 11B is a timing chart showing a sampling frequency conversion period announcing signal SF.

FIG. 11C is a timing chart showing an input 1-bit digital signal SA.

FIG. 11D is a timing chart showing an interpolated 1-bit digital signal SB.

FIG. 11E is a timing chart showing a 1-bit digital signal SD outputted by a changeover switch 117.

FIG. 20A is a timing chart showing a sampling frequency conversion period announcing signal SF.

FIG. 20B is a timing chart showing an input 1-bit digital signal SD shown in FIG. 19.

FIG. 20C is a timing chart showing a downsampled 1-bit audio signal SG' shown in FIG. 19.

FIG. 25A shows data recorded on the recording/reproducing medium 46 in FIG. 24.

FIG. 25B is a timing chart showing a sampling frequency conversion period announcing playback signal SI shown in FIG. 24.

FIG. 25C shows changes in the recording linear velocity of a recording/reproducing medium of FIG. 24 at a switching timing.

FIG. 25D shows a timing chart of a multi-rate 1-bit playback audio signal SR.

FIG. 25E is a timing chart for a bit playback audio signal SJ with a sampling frequency of 64×fs.

DESCRIPTION OF THE PREFERRED EMBODIMENTS

Figure 1:
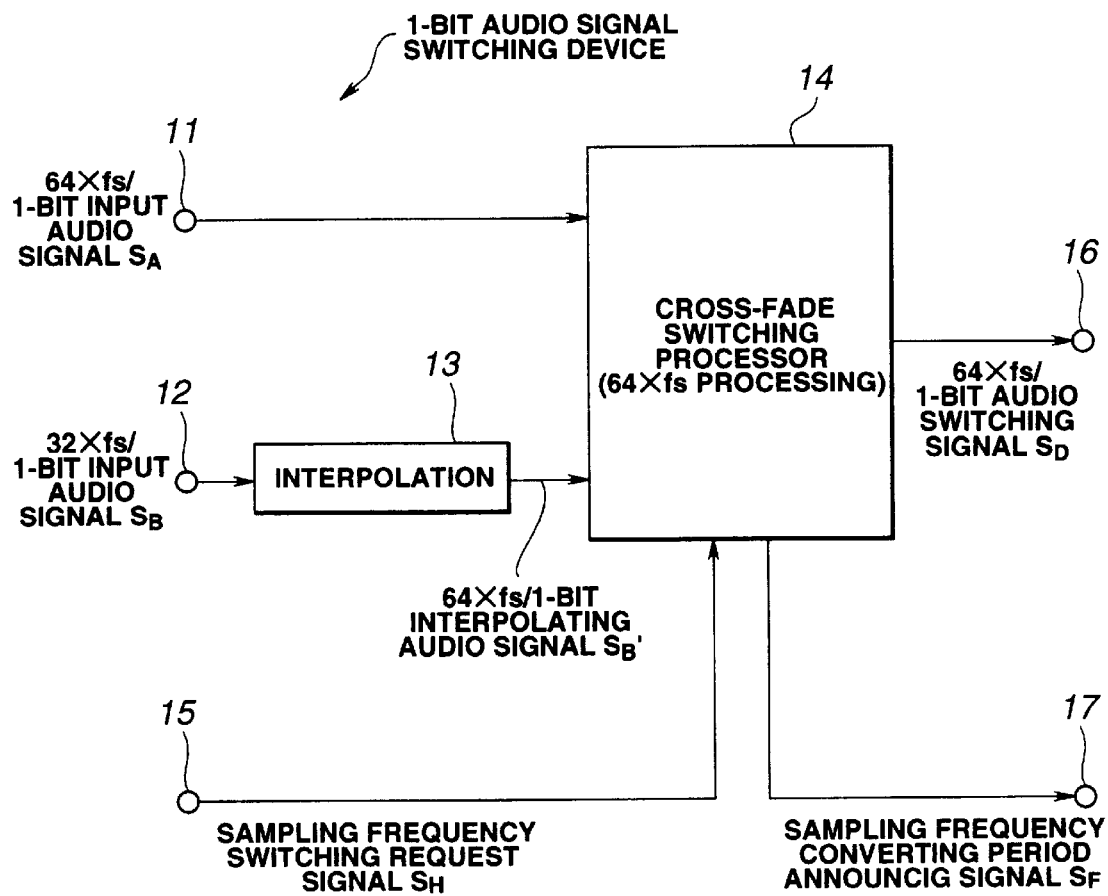
FIG. 1 is a block diagram of a 1-bit audio signal switching device embodying the present invention.

Referring to the drawings, preferred embodiments of a digital signal processing device, recording device and reproducing device according to the present invention will be explained in detail.

First, a preferred embodiment of the digital signal processing device will be explained with reference to FIGS. 1 to 8. The instant embodiment is a 1-bit audio signal switching device designed for switching between a 1-bit audio signal SA obtained on ΣΔ modulation using a sampling frequency of 64×fs equal to 64 times the sampling frequency fs (=44.1 kHz) of the compact disc standard and a 1-bit audio signal SB obtained on ΣΔ modulation using a sampling frequency of 32×fs. The signals SA and SB are sometimes referred to hereinafter as 64×fs/1 bit input audio signal and a 32×fs/1 bit input audio signal, respectively.

Referring to FIG. 1, this 1-bit audio signal switching device takes in the 64×fs/1 bit input audio signal SA and the 32×fs/1 bit input audio signal SB at input terminals 11 and 12, respectively.

Although differing in the sampling frequency, the 64×fs/1 bit input audio signal SA or the 32×fs/1 bit input audio signal SB is generated by the ΣΔ modulator shown in FIG. 2.

This ΣΔ modulator furnishes the input audio signal via the input terminal 1 via adder 2 to an integrator 3. An output of the integrator 3 is furnished to a comparator 4 where it is compared to, for example, a neutral point potential ('0V') of the input audio signal and quantized into a 1-bit signal every sampling period. The sampling frequency, that is the frequency for the sampling period, is 64×fs or 32×fs, as stated above. This quantized data is fed out at output terminal 5 and sent via a 1-sample delay unit 6 and a 1-bit digital/analog (D/A) converter 7 to an adder 2 for addition to the input audio signal from the input terminal 1. This causes the comparator 4 to output the 64×fs/1 bit input audio signal SA or the 32×fs/1 bit input audio signal SB to input terminals 11 or 12 of the 1-bit input audio signal switching device.

The 1-bit digital signal switching device includes an interpolating unit 13 for processing the 32×fs/1 bit input audio signal SB from the input terminal 12 with previous value holding processing for outputting a 1-bit interpolated audio signal with the sampling frequency 64×fs, sometimes referred to herein as a 64×fs/1 bit interpolated audio signal, and a cross-fading switching processing unit 14 for processing the 64×fs/1 bit interpolated audio signal SB' from the interpolating unit 13 and the 64×fs/1 bit input audio signal SA with cross-fading by way of noise-free switching for outputting a 64×fs 1-bit audio changeover signal SD at an output terminal 16.

The interpolating unit 13 directly holds the samples of the repeats of the 32×fs/1 bit input audio signal SB and repeats the samples for outputting a 64×fs/1 bit interpolated audio signal SB in which the two samples of the same data occur in succession, as shown in FIG. 3A and FIG. 3B. This 64×fs/1 bit interpolated audio signal SB' has a rate twice that of the 32×fs/1 bit input audio signal SB.

Figure 4:
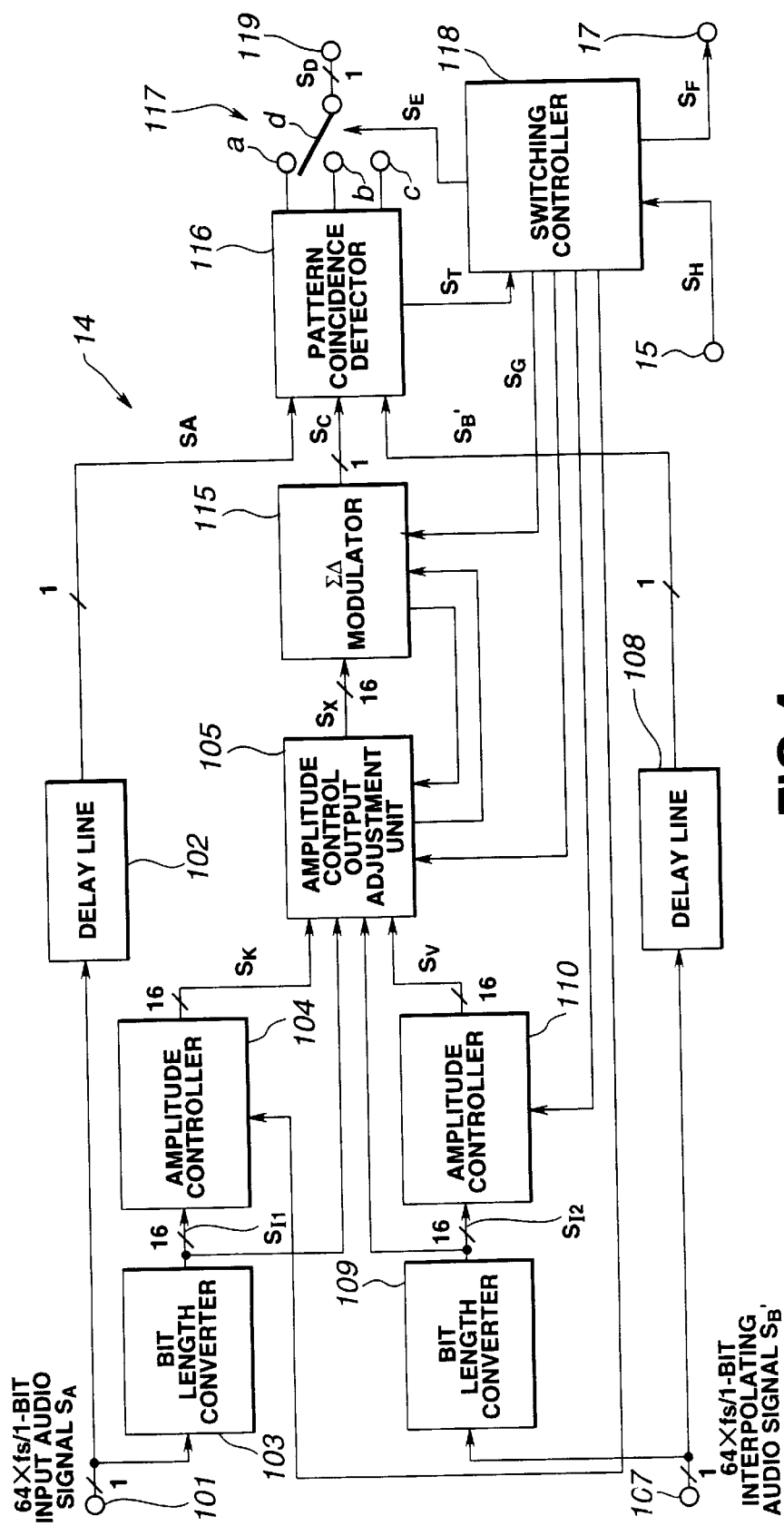
FIG. 4 is a block diagram showing details of the block diagram of FIG. 1.

Referring to FIG. 4, the cross-fading switching processing unit 14 has a ΣΔ modulator 115 for outputting a 1-bit ΣΔ re-modulated signal of 64×fs, with a gain ratio between the initial stage feedback loop and the next-stage feedback loop of 16, sometimes referred to herein as a 64 fs/1 bit ΣΔ re-modulated signal, and a delay line 102 for delaying the 64×fs/1 bit input audio signal SA from an input terminal 101 a pre-set number of samples. The cross-fading switching processing unit 14 also has a bit length converter 103 for matching the amplitude level of the 64×fs/1 bit input audio signal SA to the amplitude level of the feedback signal to the initial stage integrator used in a ΣΔ modulator 115, and an amplitude controller 104 for controlling the amplitude level of the first level adjustment signal having its amplitude level adjusted by the bit length converter 103. The cross-fading switching processing unit 14 also has a delay line 108 for delaying the 64×fs/1 bit interpolated audio signal SB' a pre-set number of samples, a bit length converter 109 for matching the amplitude level of the 64×fs/1 bit interpolated audio signal SB' to the amplitude level of the feedback signal to the initial stage integrator used in the ΣΔ modulator 115 and an amplitude controller 110 for controlling the amplitude level of the second level adjustment signal having its amplitude level adjusted by the bit length converter 109. The cross-fading switching processing unit 14 also has an amplitude control output adjustment unit 105 comprised of a subtraction value computing controller for generating a signal for ΣΔ re-modulation from the two input/output signals of the amplitude controllers 104, 110 and/or from the signal in the ΣΔ modulator 115 and for generating and subtracting subtraction data obtained on controlling processing during the amplitude controlling period. The cross-fading switching processing unit 14 further has a switching controller 118 for controlling the amplitude controllers 104, 110, ΣΔ modulator 115, amplitude control output adjustment unit 105 and a changeover switch 117, and a pattern coincidence detector 116 for detecting coincidence between the 1-bit input audio signal supplied from delay line 102, a 1-bit interpolated audio signal SB' supplied from the delay line 108 and an output SC of the ΣΔ modulator 115.

Figure 5:
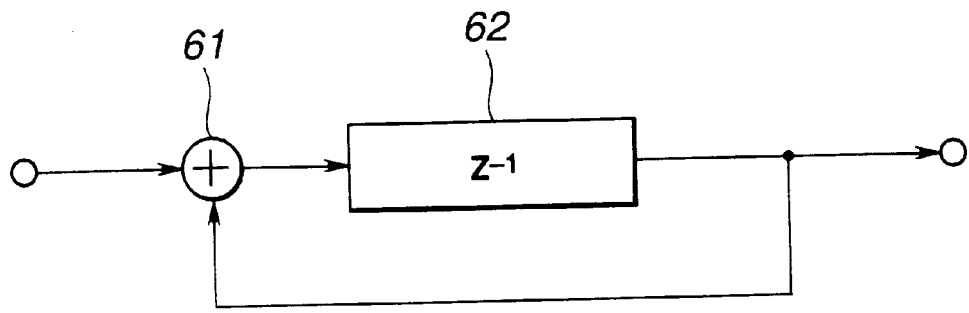
FIG. 5 is a circuit diagram of an integrator constituting a ΣΔ modulator.
Figure 6:
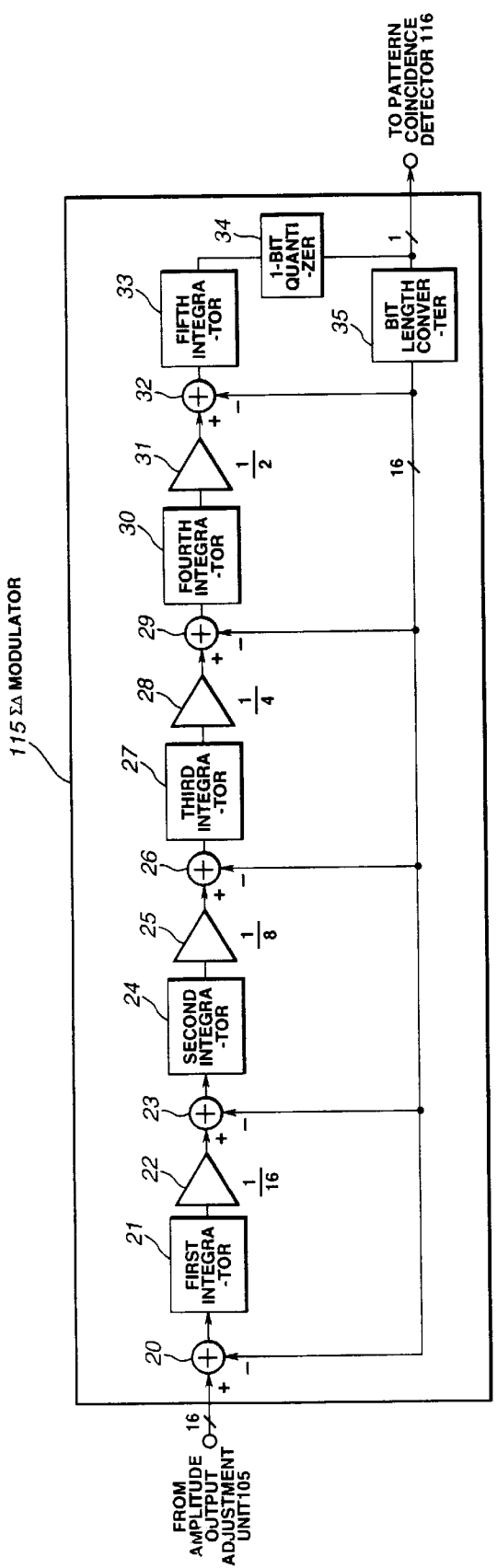
FIG. 6 shows the internal structure of a ΣΔ modulator 115.

The ΣΔ modulator 115 is a five-order ΣΔ modulator made up of five integrators configured for shifting a sum output of the adder 61 by a shifter 62 and subsequently returning the shifted output to the adder 61, as shown in FIG. 5. That is, the 16-bit signal SX, outputted by the amplitude control output adjustment unit 105 so as to be supplied to the ΣΔ modulator 115, is integrated via adder 20 by a first integrator 21 and multiplied by a coefficient 1/16 by a first coefficient multiplier 22 before being fed to the second stage, as shown in FIG. 6. The input signal to the second stage is integrated via adder 23 by a second integrator 24 so as to be multiplied by a coefficient 1/8 by a second coefficient multiplier 25 before being sent to the third stage. The input signal to the third stage is integrated via a third stage adder 26 by a third integrator 27 so as to be multiplied by a coefficient 1/4 by a third coefficient multiplier 28 before being sent to the fourth stage. The input signal to the fourth stage is integrated via adder 29 by a fourth integrator 30 so as to be multiplied by a coefficient 1/2 by a fourth coefficient multiplier 31 before being sent to the fifth stage. The input signal to the fifth stage is integrated via adder 32 by the fifth integrator 33 and quantized by a 1-bit quantizer 34 into a 1-bit signal which is sent to the pattern coincidence circuit 116. The 1-bit signal is also converted by a bit length converter 35 into a 16-bit signal which is fed back to the adders 20, 23, 26, 29 and 32.

Therefore, the gain ratio of the next-stage feedback loop to the initial stage feedback loop on both sides of the 1-bit quantizer in the ΣΔ modulator 115, excluding the integrator, is an integer value of 16. The number of delay samples in the delay lines 102, 108 is set to 16 in meeting with this gain ratio 16.

Figure 7:
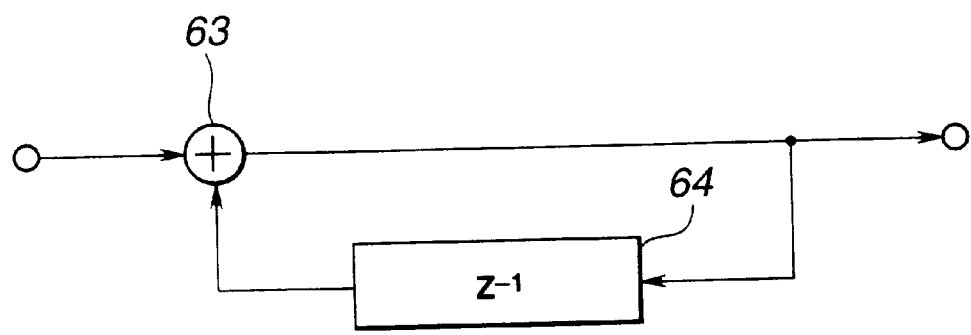
FIG. 7 is a circuit diagram of a second embodiment of an integrator constituting a ΣΔ modulator.

Meanwhile, the ΣΔ modulator 115 may be configured as a five-order ΣΔ modulator comprised of five serially connected integrators configured for delaying the sum output of the adder 63 shown in FIG. 7 by a shifter 64 during feedback of the sum output of the adder 63 shown in FIG. 7 to the adder 63, as shown in FIG. 6. In this case, the pre-set number of samples is 15 (=16−1) corresponding to the gain ratio 16.

During the time the delay signals from the delay lines 102, 108 are switched and selected, the ΣΔ modulator 115 sets the initial value of the enclosed integrator to 0.

The cross-fading switching processor 14 has a pattern coincidence detector 116 for detecting the coincidence over a plurality of samples between the 64×fs/1 bit input audio signal SA and the 64×fs/1 bit interpolated audio signal SB'. Using a control signal obtained by the pattern coincidence detector 116, the changeover switch 117 switches between the 64×fs/1 bit input audio signal SA, 64×fs/1 bit interpolated audio signal SB' and the 64×fs/1 bit ΣΔ re-modulated signal SC.

Figure 8:
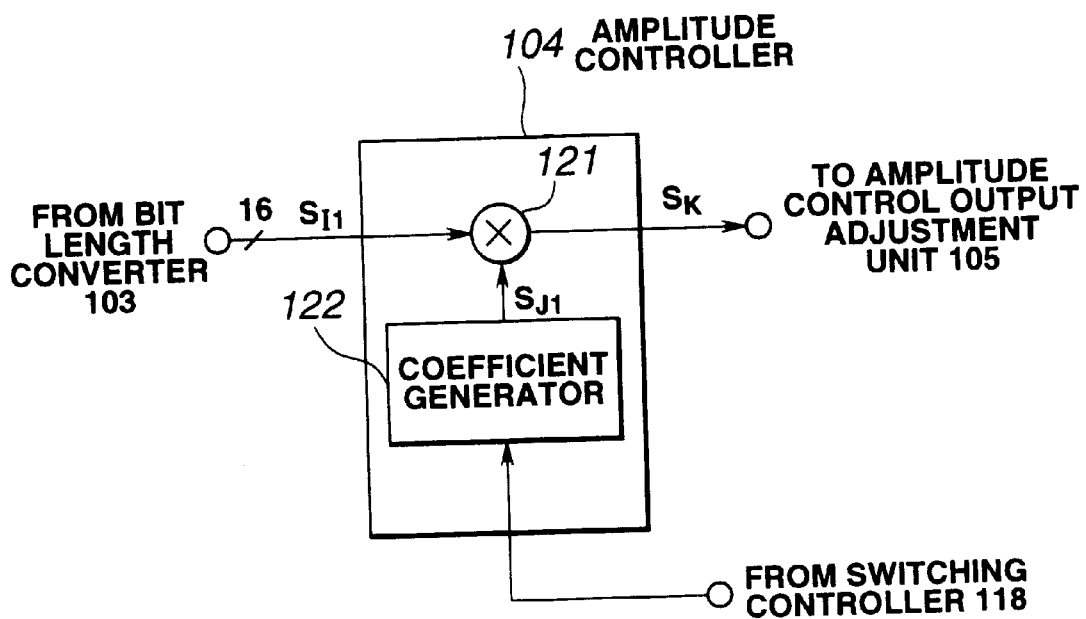
FIG. 8 is a block diagram of an amplitude controller 104 shown in FIG. 4.

Referring to FIG. 8, the amplitude controller 104 has a multiplier 121 and a coefficient generator 122. The multiplier 121 multiplies a first level adjustment signal SI1 from the bit length converter 103 with a coefficient output Sj1 from a coefficient generator 122. The amplitude controller 104 then routes the amplitude controller output SK to the amplitude control output adjustment unit 105.

Figure 9:
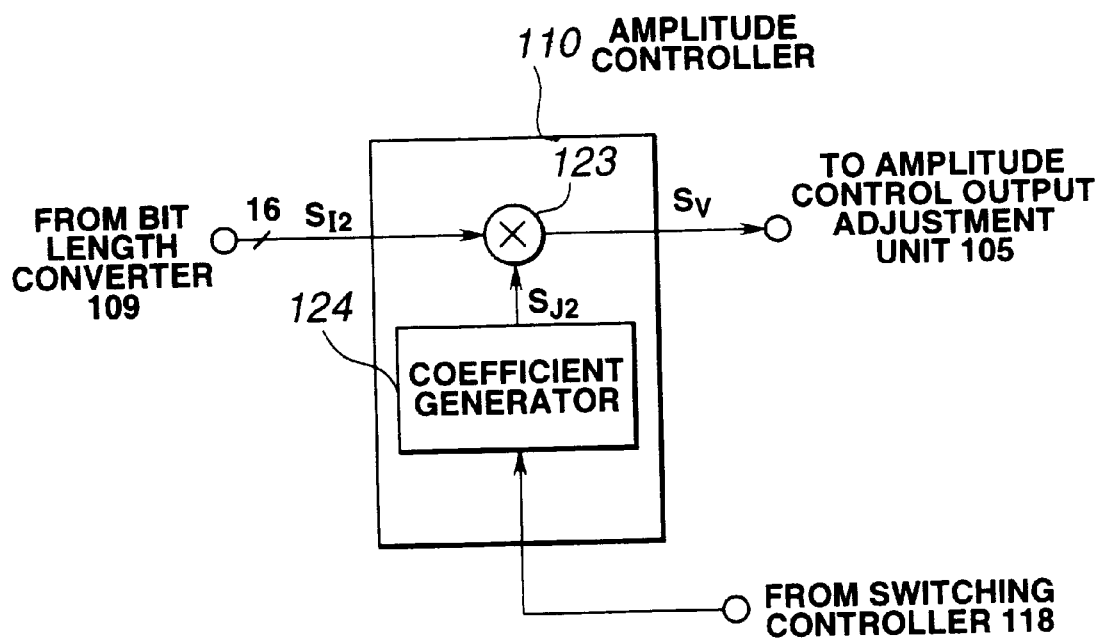
FIG. 9 is a block diagram of an amplitude controller 110 shown in FIG. 4.

Referring to FIG. 9, the amplitude controller 110 has a multiplier 123 and a coefficient generator 124. The multiplier 123 multiplies a first level adjustment signal SI2 from the bit length converter 109 with a coefficient output Sj2 from a coefficient generator 124. The amplitude controller 110 then routes the amplitude controller output SV to the amplitude control output adjustment unit 105.

The subtraction value computing controller in the amplitude control output adjustment unit 105 may be configured in many ways. An illustrative structure will be explained subsequently.

Figures 10A, 10B:
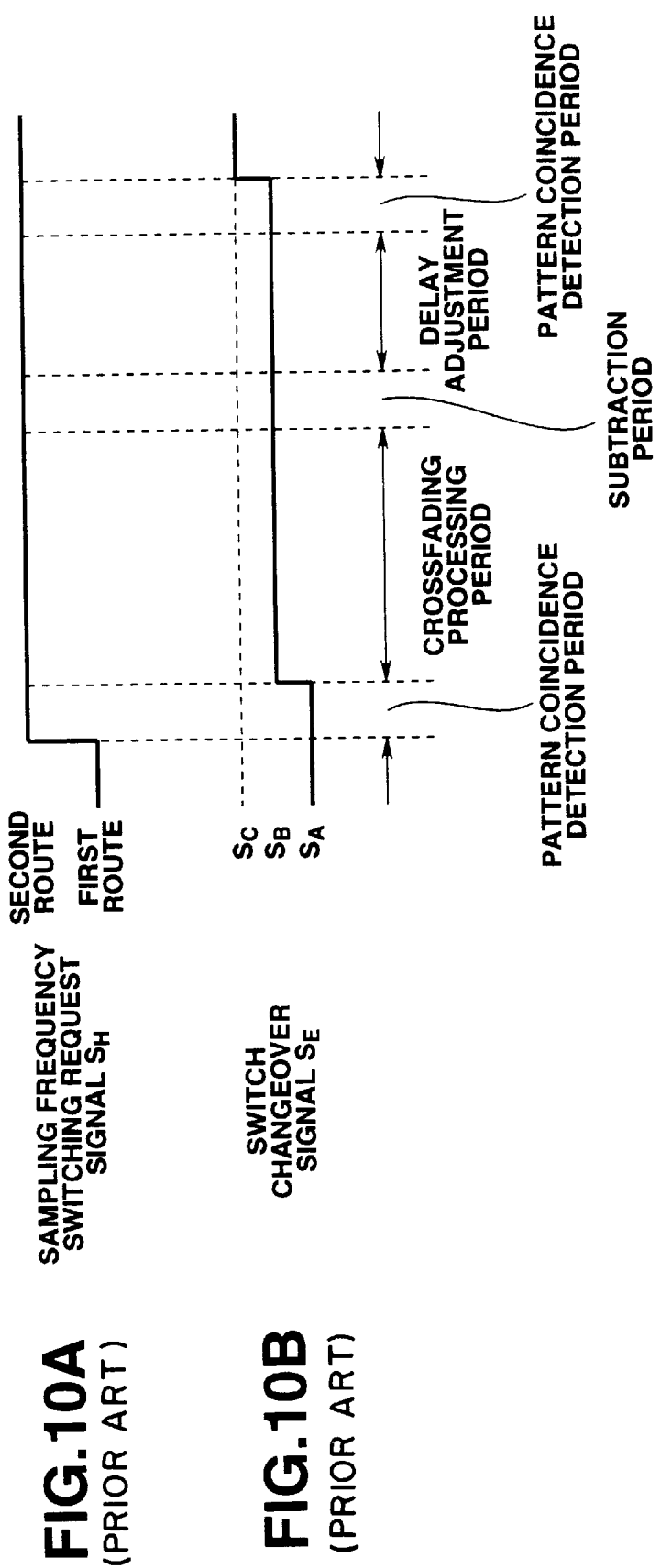
FIG. 10A is a timing chart of a sampling frequency switching request signal SH for switching from an input 1-bit digital signal SA to an interpolated 1-bit digital signal SC for inputting.
FIG. 10B is a timing chart showing the timing of switching from the input 1-bit digital signal SA to the interpolated 1-bit digital signal SC for inputting via a 1-bit digital signal SB quantized by re-quantizer means.

The cross-fading processing operation, carried out by the cross-fading switching processor 14, along with the cross-fading, will be explained with reference to FIGS. 10A and 10B. FIGS. 10A, 10B are timing charts for switching control carried out by the switching controller 118 for the changeover switch 117 when the sampling frequency switching request signal SH is supplied to a control signal input terminal 15 of FIG. 4.

First, on reception of the sampling frequency switching request signal SH via control signal input terminal 15, the switching controller 118 awaits the pattern coincidence processing by a pattern coincidence detector 116. After the end of this pattern coincidence processing, the switching controller 118 routes the switch changeover signal SE to the changeover switch 117 for switching from the 64×fs/1 bit input audio signal SA to the 64×fs/1 bit ΣΔ re-modulated signal SC.

At this time, as shown in FIG. 4, a sum signal SX resulting from addition by the amplitude control output adjustment unit 105 of the amplitude controller output SK obtained by setting the coefficient of the coefficient generator 122 in the amplitude controller 104 to 1 and the amplitude controller output SV obtained by setting the coefficient of the coefficient generator 124 in the amplitude controller 110 to 0 is entered to the ΣΔ modulator 115.

The switching controller 118 then causes transition of the coefficient generator output SJ1 of the coefficient generator 122 in the amplitude controller 104 from 1 to 0 and transition of the coefficient generator output SJ2 of the coefficient generator 124 in the amplitude controller 110 from 0 to 1.

The amplitude control output adjustment unit 105 is supplied with a gradually decreasing amplitude controller output SK and with a gradually increasing amplitude controller output SV. The amplitude control output adjustment unit 105 routes the cross-fading processed sum signal SX to the ΣΔ modulator 115. After the end of the cross-fading processing, the subtraction data obtained on control processing during the cross-fading processing period is gradually subtracted from the sum signal or from the inside of the ΣΔ modulator. After the end of subtraction processing, and after the end of the pattern coincidence processing in the pattern coincidence detector 116, a switch changeover signal SE is routed to the changeover switch 117 for switching from the 64×fs/1 bit ΣΔ re-modulated signal SC to the 64×fs/1 bit interpolated audio signal SB'.

In this manner, the cross-fading switching processor 14 switches the 64×fs/1 bit input audio signal SA to the 64×fs/1 bit interpolated audio signal SB'. Also, using the switching controller 118, the cross-fading switching processor 14 derives the sampling frequency conversion period announcing information SF from the output terminal 17. This sampling frequency conversion period announcing information SF is a signal in the 64×fs/1 bit audio switching signal SD announcing the period of the 64×fs/1 bit interpolated audio signal SB' in which is interpolated the 32×fs/1 bit input audio signal SB.

Referring to FIGS. 11A to 11E, the overall operation of the 1-bit audio signal switching device, having the above embodiment and having the cross-fading switching processor 14, is hereinafter explained.

When the sampling frequency switching request signal SH is routed to the cross-fading switching processor 14, the switching transition occurs from the 64×fs/1 bit input audio signal SA through the 64×fs/1 bit ΣΔ re-modulated signal SC to the 64×fs/1 bit interpolated audio signal SB'. The 64×fs/1 bit audio switching signal SD is outputted at the output terminal 16. Here, the 32×fs/1 bit interpolated audio signal SB is converted by the interpolation unit 13 to the 64×fs/1 bit interpolated audio signal SB'. Thus, the cross-fading switching processor 14 operates as if it cross-fades two 64×fs/1 bit input audio signals with each other.

Since the 64×fs/1 bit interpolated audio signal SB' is a signal in which two samples of the same data are connected to each other, the 64×fs/1 bit audio switching signal SD, obtained on switching accompanied by cross-fading by the cross-fading switching processor 14, undergoes transition which appears as if switching from the 64×fs/1 bit audio signal to the 32×fs/1 bit occurred.

Thus, when the 1-bit output signal derived from the output terminal 16 of the 1-bit audio signal switching device is reverted to the analog audio signal via a low-pass filter, one can hear the noise-suppressed switching sound from the 64×fs/1 bit input audio signal SA to the 32×fs/1 bit interpolated audio signal SB.

Meanwhile, the amplitude control output adjustment unit 105 of the cross-fading switching processor 14 may be configured as in several illustrative examples given below.

Figure 12:
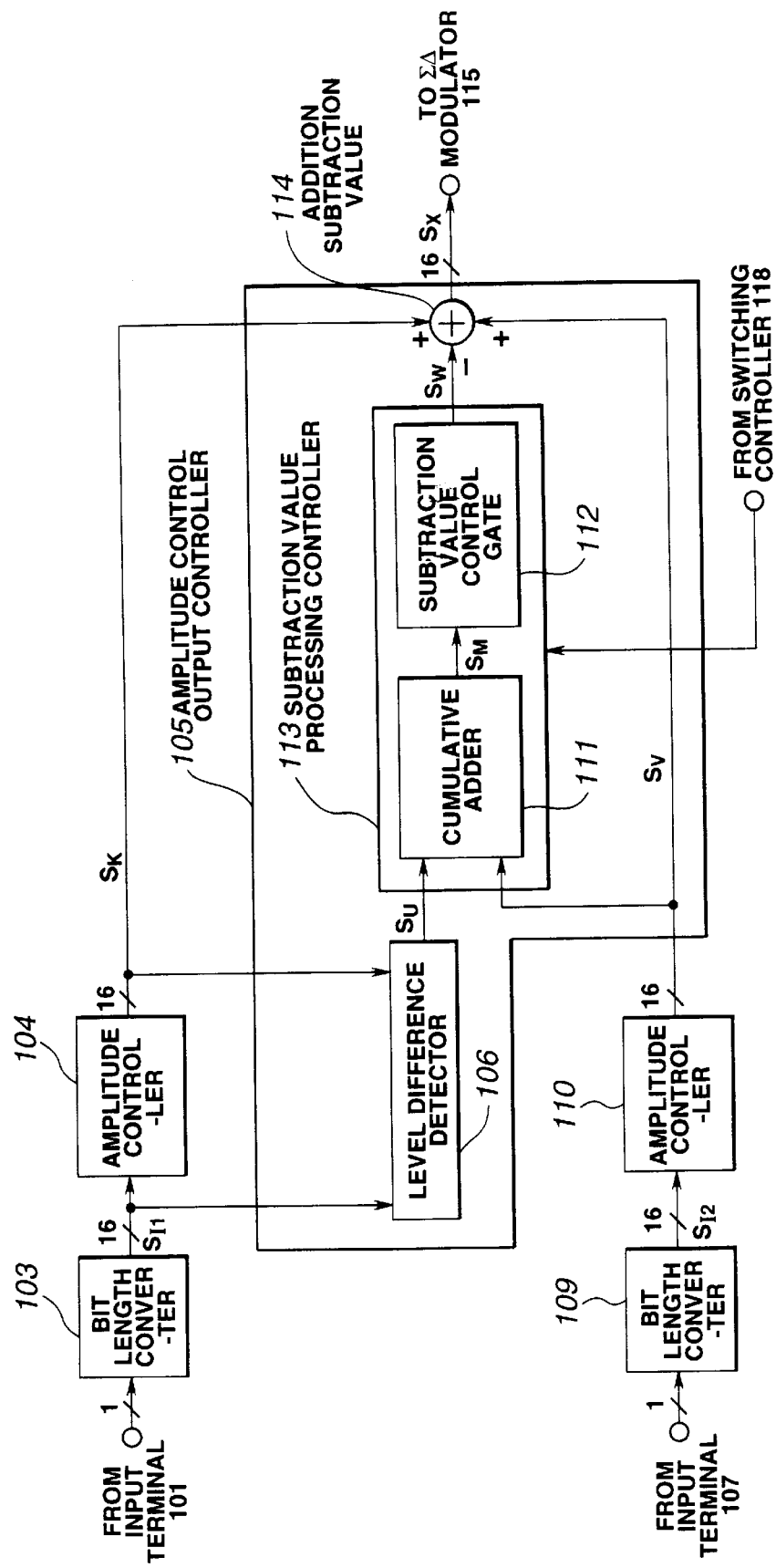
FIG. 12 is a block diagram showing a first embodiment of an amplitude control output adjustment unit 105 of FIG. 4.
Figure 13:
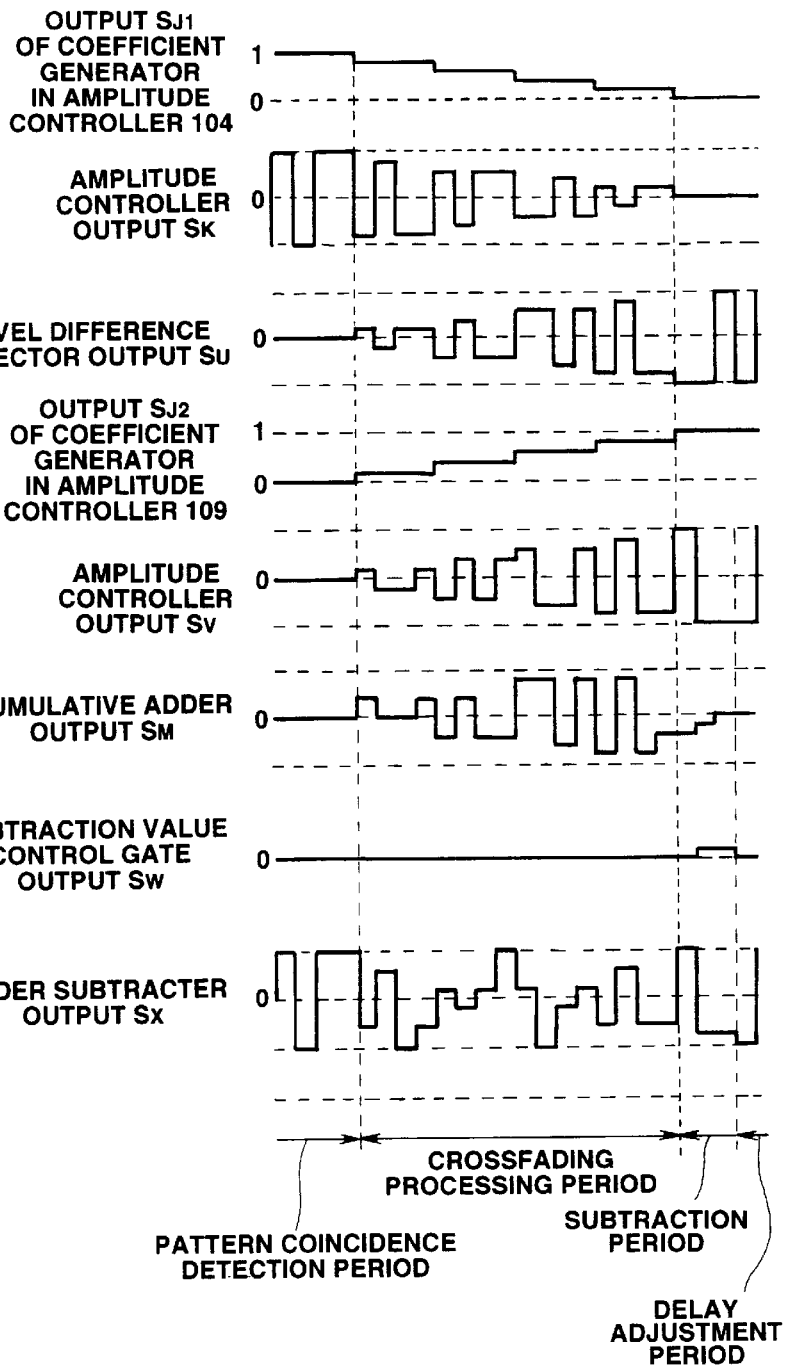
FIG. 13A is a timing chart showing a coefficient generator output Sj1 in an amplitude controller 104.
FIG. 13B is a timing chart showing an output SK in the amplitude controller 104.
FIG. 13C is a timing chart showing an output SU of a level difference detector.
FIG. 13D is a timing chart showing a coefficient generator output Sj2 in an amplitude controller 109.
FIG. 13E is a timing chart showing an output SV in the amplitude controller 109.
FIG. 13F is a timing chart showing a cumulative adder output SM.
FIG. 13G is a timing chart showing a subtraction value control gate output SW.
FIG. 13H is a timing chart for an addition/subtraction output SX.

A first illustrative example of the amplitude control output adjustment unit 105 shown in FIG. 12 is explained.

The amplitude control output adjustment unit 105 includes a level difference detector 106 for detecting a level difference between the first level adjustment signal from the bit length converter 103 and an amplitude control output of the amplitude controller 104. The amplitude control output adjustment unit 105 also includes a cumulative adder 111 for cumulatively adding, with an amplitude level width length, a level difference SU from the level difference detector 106 and the amplitude control output SV corresponding to the amplitude-controlled second level adjustment signal from the bit length converter 109 outputted by the amplitude controller 110, for the amplitude level control period of the first and second level adjustment signals, and a subtraction value computing control gate 112 for gradually subtracting, by the adder/subtractor 114, the cumulative sum SM of the cumulative adder 111 and the first and second level adjustment signals. The cumulative adder 111 and the subtraction value control gate 112 make up a subtraction value computing controller 113. The arrangement of FIG. 12 is otherwise the same as that shown in FIG. 4. The timing chart for switching control performed by the switching controller 118 on the changeover switch 117 is similar to that shown in FIG. 10.

The operation of the cross-fading switching controller 14 with the amplitude control output adjustment unit 105 of the above-described first illustrative example is explained by referring to a comprehensive timing chart shown in FIGS. 13A to 13H.

On reception of the sampling frequency switching request signal SH via control signal input terminal 15, the switching controller 118 first awaits the pattern coincidence processing in the pattern coincidence detector 116 and, after pattern coincidence detection, routes the switch changeover signal SE to the changeover switch 117 for switching from the 64×fs/1 bit input audio signal SA through the 64×fs/1 bit ΣΔ re-modulated signal SC.

At this time, a sum signal SX resulting from addition by the adder 114 of the amplitude control output adjustment unit 105 of the amplitude controller output SK obtained by setting the coefficient of the coefficient generator 122 in the amplitude controller 104 to 1 and the amplitude controller output SV obtained by setting the coefficient of the coefficient generator 124 in the amplitude controller 110 to 0 is entered to the ΣΔ modulator 115.

The switching controller 118 then causes transition of the coefficient generator output SJ1 of the coefficient generator 122 in the amplitude controller 104 from 1 to 0 and transition of the coefficient generator output SJ2 of the coefficient generator 124 in the amplitude controller 110 from 0 to 1.

In the interim, the level difference detector 106 detects the difference SU of the input signal level to the adder/subtractor 114 from the amplitude level (maximum amplitude level) of the level adjustment signal SI1. The switching controller 118 controls the cumulative adder 111 in the interim for cumulatively adding the level difference SU and the output SV of the amplitude controller 110.

When the switching coefficient generator outputs SJ1 and SJ2 reach 0 and 1, respectively, the switching controller 118 causes the data SM stored in the cumulative adder 111 to be gradually subtracted from the amplitude controller output SK and the amplitude controller output SV by the adder/subtractor 114 via subtractor control gate 112.

When the cumulative sum value SM of the cumulative adder 111 is 0, the switching controller 118 performs switching control from the 64×fs/1 bit ΣΔ re-modulated signal SC to the 64×fs/1 bit interpolated audio signal SB'.

Figure 14:
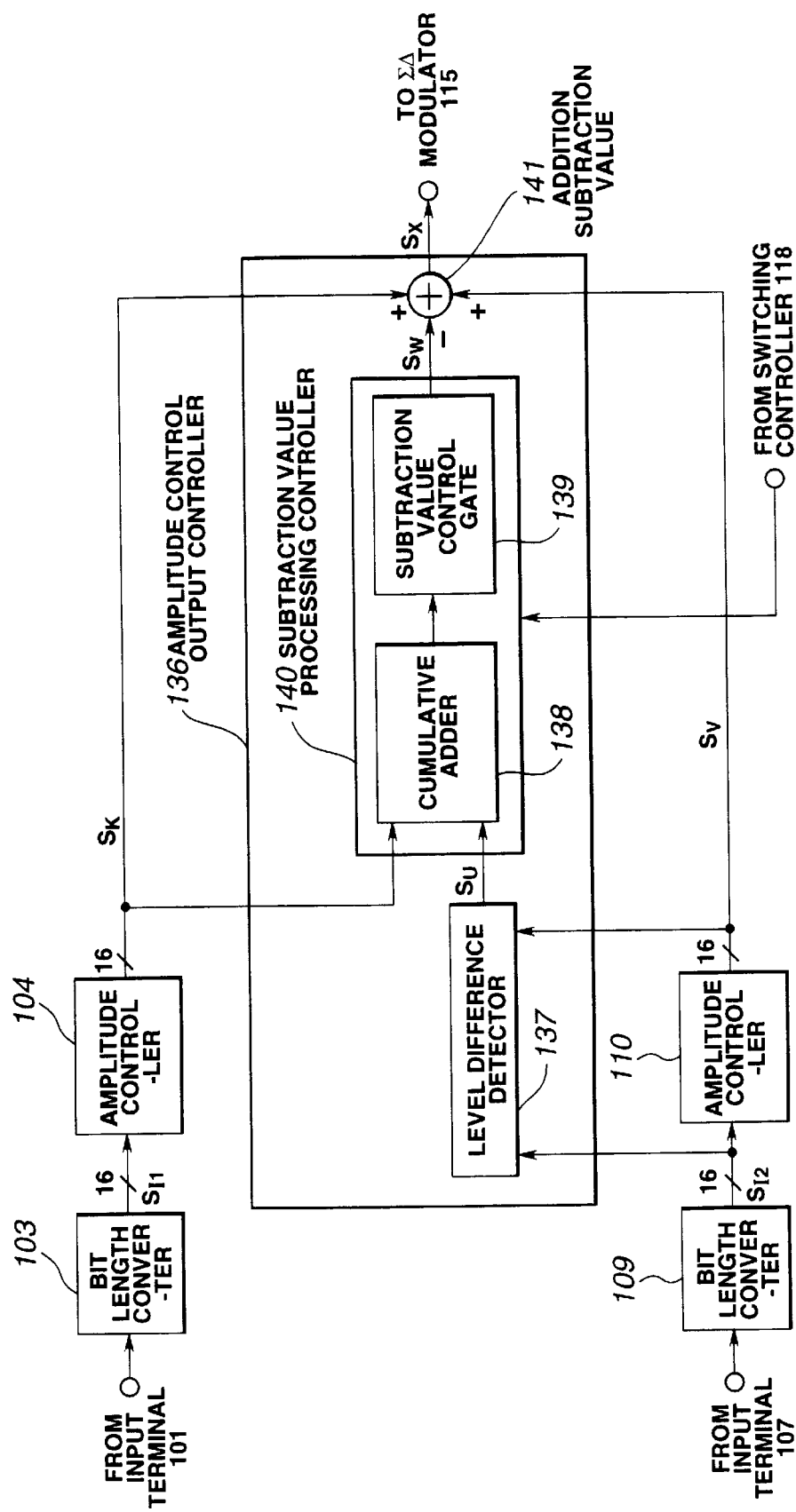
FIG. 14 is a block diagram of a second embodiment of an amplitude control output adjustment unit 105 of FIG. 4.
Figure 15:
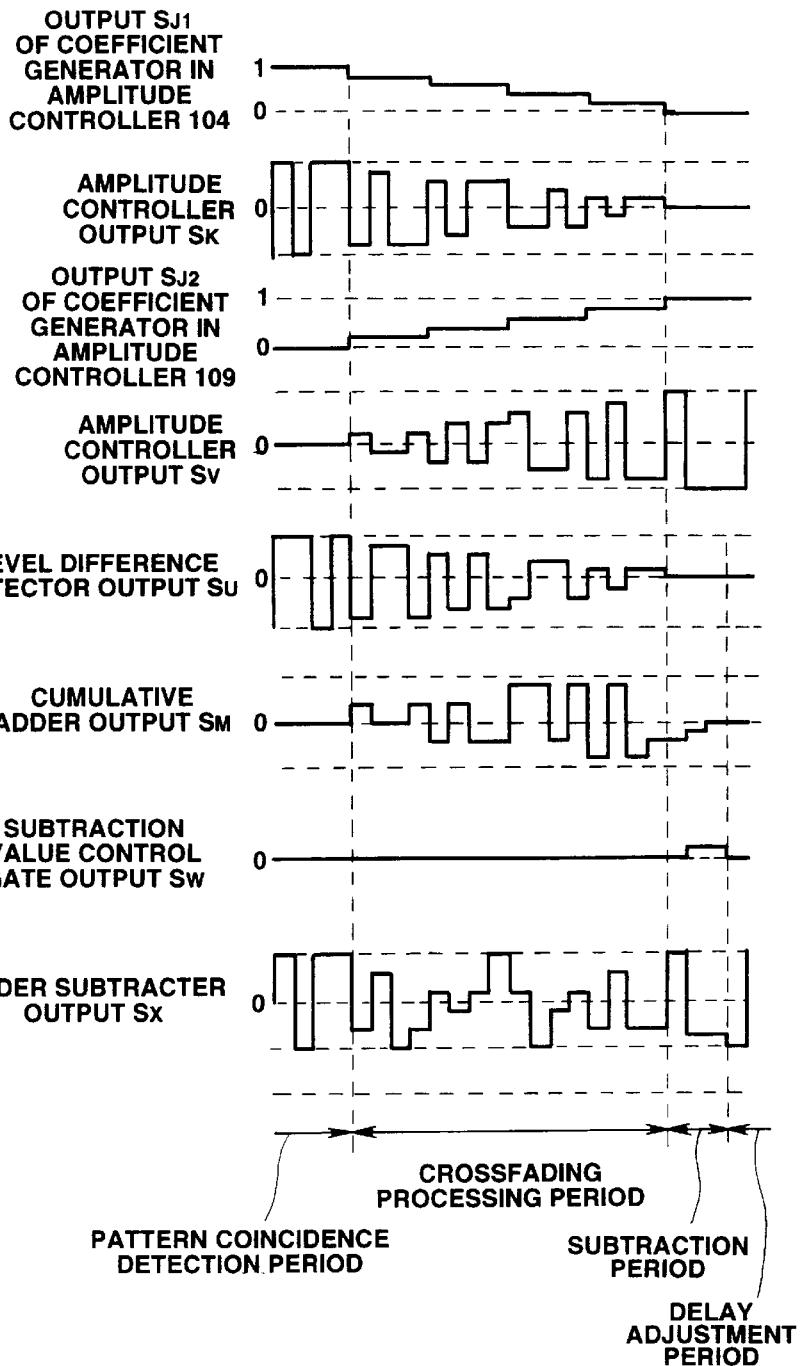
FIG. 15A is a timing chart showing a coefficient generator output Sj1 in the amplitude controller 104.
FIG. 15B is a timing chart showing an output SK in the amplitude controller 104.
FIG. 15C is a timing chart showing the coefficient generator is output Sj2 in the amplitude controller 109.
FIG. 15D is a timing chart showing the output SV in the amplitude controller 109.
FIG. 15E is a timing chart showing an output SU of the level difference detector.
FIG. 15F is a timing chart showing the cumulative adder output SM.
FIG. 15G is a timing chart showing the subtraction value control gate output SW.
FIG. 15H is a timing chart for the addition/subtraction output SX.

The amplitude control output adjustment unit 105 of the cross-fading switching processor 14 may be configured as in an amplitude control output adjustment unit 136 (second illustrative example) shown in FIG. 14.

The amplitude control output adjustment unit 136 includes a level difference detector 137 for detecting the level difference of the second level adjustment signal and the signal level after amplitude control by the amplitude controller 110, and a cumulative adder 138 for cumulatively adding, with an amplitude level width length, a level difference from the level difference detector 137 to the signal level after the amplitude controller 104 has controlled the amplitude level of the first level adjustment signal, for the amplitude level control period of the first and second level adjustment signals, and a subtraction value computing control gate 139 for gradually subtracting, by the adder/subtractor 141, the cumulative sum of the cumulative adder 138 from the first and second level adjustment signals. The cumulative adder 138 and the subtraction value control gate 139 make up a subtraction value computing controller 140.

The operation of the cross-fading switching controller 14 employing the amplitude control output adjustment unit 136 is explained by referring to the overall timing chart shown in FIGS. 15A to 15H. The timing chart for switching control performed by the switching controller 118 on the changeover switch 117 is similar to that shown in FIG. 10.

On reception of the sampling frequency switching request signal SH via control signal input terminal 15, the switching controller 118 first awaits the pattern coincidence processing in the pattern coincidence detector 116 and, after pattern coincidence detection, routes the switch changeover signal SE to the changeover switch 117 for switching from the 64×fs/1 bit input audio signal SA to the 64×fs/1 bit ΣΔ re-modulated signal SC.

At this time, a sum signal SX resulting from addition by the adder/subtractor 114 of the amplitude control output adjustment unit of the amplitude controller output SK obtained by setting the coefficient of the coefficient generator 122 in the amplitude controller 104 to 1 and the amplitude controller output SV obtained by setting the coefficient of the coefficient generator 124 in the amplitude controller 110 to 0 is entered to the ΣΔ modulator 115.

The switching controller 118 then causes transition of the coefficient generator output SJ1 of the coefficient generator 122 in the amplitude controller 104 from 1 to 0 and transition of the coefficient generator output SJ2 of the coefficient generator 124 in the amplitude controller 110 from 0 to 1.

In the interim, the level difference detector 137 detects the difference SU of the input signal level to the adder/subtractor 141 from the amplitude level (maximum amplitude level) of the level adjustment signal SI2. The switching controller 118 controls the cumulative adder 138 in the interim for cumulatively adding the level difference SU and the output SK of the amplitude controller 104.

When the switching coefficient generator outputs SJ1 and SJ2 reach 0 and 1, respectively, the switching controller 118 causes the data SM stored in the cumulative adder 138 to be gradually subtracted from the amplitude controller output SK and the amplitude controller output SV by the adder/subtractor 141 via subtraction control gate 139.

When the cumulative sum value SM of the cumulative adder 138 is 0, the switching controller 118 performs switching control from the 64×fs/1 bit ΣΔ re-modulated signal SC to the 64×fs/1 bit interpolated audio signal SB' via pattern coincidence following a pre-set sample delay.

Figure 16:
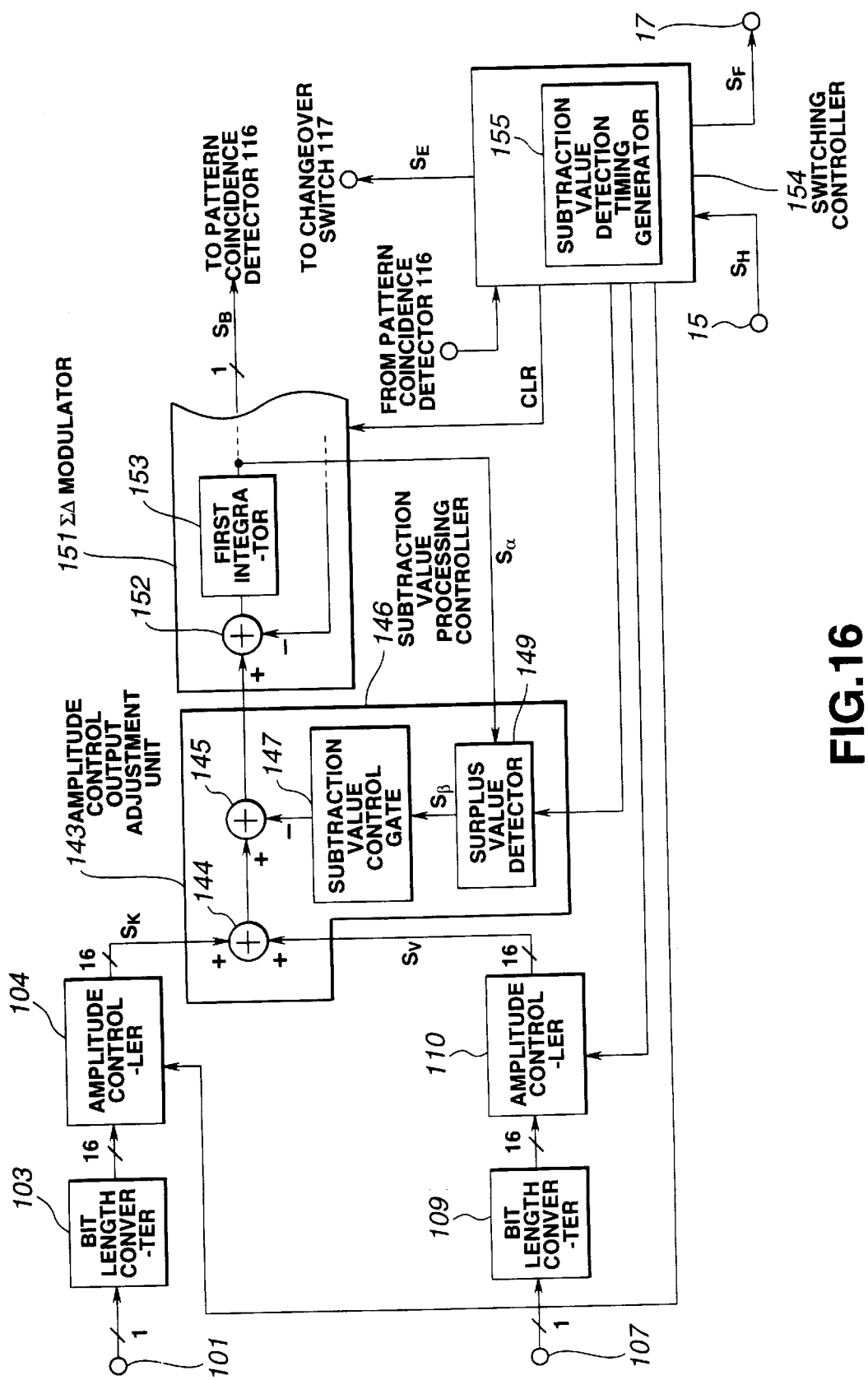
FIG. 16 is a block diagram showing a third embodiment of the amplitude control output adjustment unit 105 of FIG. 4.

The cross-fading switching processor 14 may be configured to use an amplitude control output adjustment unit 143 (third illustrative example) shown in FIG. 16.

The amplitude control output adjustment unit 143 includes a surplus value detector 149 for detecting the surplus value of an integrated value Sα of the first integrator 153 in a ΣΔ modulator 151 with respect to the maximum amplitude level width (equal to twice the above-mentioned maximum amplitude level) and a subtraction value control gate 147 for gradually subtracting the surplus value detected by the surplus value detector 149 from the maximum amplitude level signal outputted by an adder 144 using an adder/subtractor 145. The surplus value detector 149 and the subtraction value control gate 147 make up a subtraction value computing controller 146.

Downstream of a first adder 152 and a first integrator 153 of the ΣΔ modulator 151 is connected a first coefficient multiplier, however, the integrated value Sα outputted by the first integrator 153 is routed to the surplus value detector 149 in the subtraction value computing controller 146.

A switching controller 154 controls the amplitude controller 104, amplitude controller 110, ΣΔ modulator 151, amplitude control output adjustment unit 143 and the changeover switch 117. The switching controller 154 is characterized in particular by having a subtraction value detection timing generator 155 generating a subtraction value timing signal in the subtraction value computing controller 146 in the amplitude control output adjustment unit 143.

The operation of the cross-fading switching processing unit 14 employing the amplitude control output adjustment unit 143 is hereinafter explained. On reception of the sampling frequency switching request signal SH via control signal input terminal 15, the switching controller 154 first awaits the pattern coincidence processing in the pattern coincidence detector 116 and, after pattern coincidence detection, routes the switch changeover signal SE to the changeover switch 117 for switching from the 64×fs/1 bit input audio signal SA through the 64×fs/1 bit ΣΔ remodulated signal SC.

At this time, a sum signal SX resulting from addition by the adder 144 of an amplitude controller output SK obtained by setting the coefficient of the coefficient generator 122 in the amplitude controller 104 to 1 and the amplitude controller output SV obtained by setting the coefficient of the coefficient generator 124 in the amplitude controller 110 to 0 is entered to the ΣΔ modulator 151.

The switching controller 154 then causes transition of the coefficient generator output SJ1 of the coefficient generator 122 in the amplitude controller 104 from 1 to 0 and transition of the coefficient generator output SJ2 of the coefficient generator 124 in the amplitude controller 110 from 0 to 1.

At a point after the outputs of the amplitude controller 104 and the amplitude controller 110 become 0 and 1 (maximum amplitude level) by the cross-fading, respectively, the subtraction value detection timing generator 155 in the switching controller 154 generates a subtraction value detection timing signal. Responsive to this subtraction value detection timing signal, the subtraction value control gate 147 takes in a surplus value Sβ from the surplus value detector 149.

After pattern coincidence processing following delay of a pre-set number of samples, the switching controller 154 controls switching from the ΣΔ modulator output SC to the interpolated signal SB'.

Figure 17:
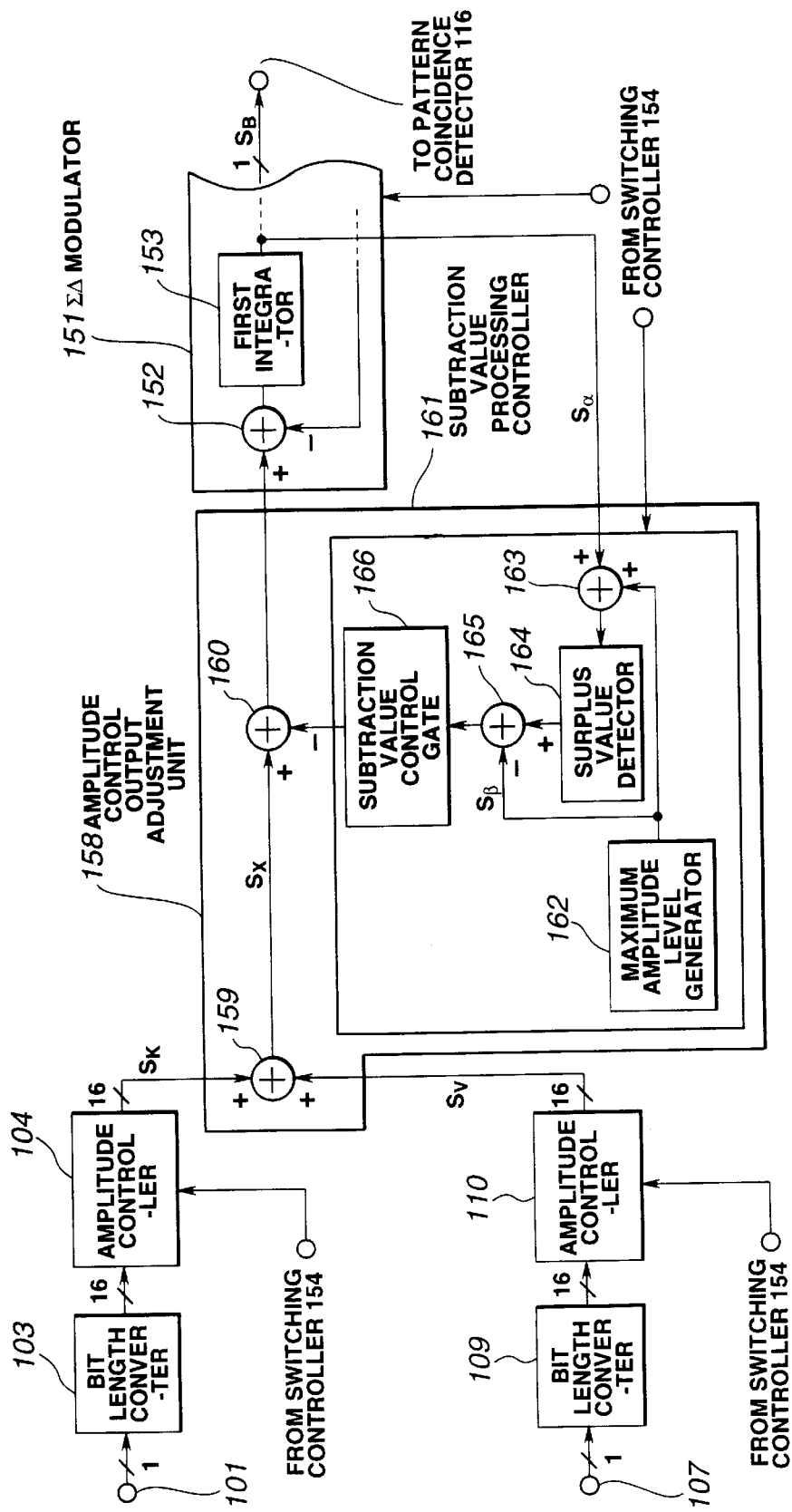
FIG. 17 is a block diagram of a fourth embodiment of the amplitude control output adjustment unit 105 of FIG. 4.

An amplitude control output adjustment unit 158 of the crossover switching processor 14 as shown in FIG. 17 (fourth illustrative example) may also be used.

The amplitude control output adjustment unit 158 includes an adder 163 for summing the positive maximum amplitude level from a maximum amplitude level generator 162 to the integrated value Sα of the first integrator 153 in the ΣΔ modulator 151, and a surplus value detector 164 for detecting the surplus value of the sum output of the adder 163 with respect to the maximum amplitude level width which is equal to twice the above-mentioned maximum amplitude level. The amplitude control output adjustment unit 158 also includes a subtractor 165 for subtracting the positive maximum amplitude level from the surplus value detected by the surplus value detector 164 and a subtraction value control gate 166 for subtracting the subtraction output Sβ of the subtractor 165 (sometimes referred to herein as the result of a sum surplus value subtraction) from the maximum amplitude level signal outputted by the adder 159 using the adder/subtractor 160. The adder 163, surplus value detector 164, subtractor 165, subtraction value control gate 166 and the maximum amplitude level generator 162 make up a subtraction value computing controller 161.

Figure 18:
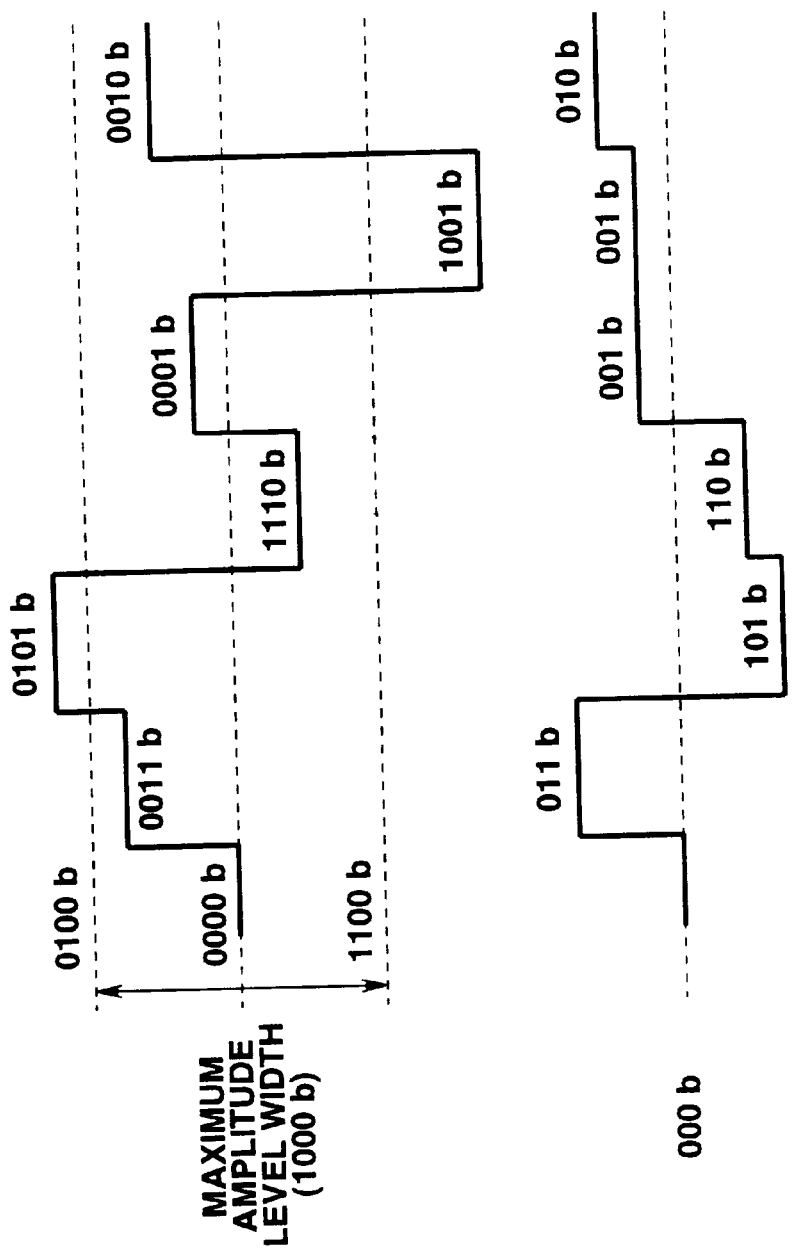
FIGS. 18A and 18B are timing charts of an integrated value Sα and Sβ, respectively.

The operation of the cross-fading switching controller 14 employing this amplitude control output adjustment unit 158 is explained by referring to FIG. 18 illustrating typical signals of the integrated value Sα and the sum surplus value subtraction result Sβ of the subtractor 165 in the case of a binary processing operation.

On reception of the sampling frequency switching request signal SH via control signal input terminal 15, the switching controller 154 first awaits the pattern coincidence processing in the pattern coincidence detector 116 and, after pattern coincidence detection, routes the switch changeover signal SE to the changeover switch 117 for switching from the 64×fs/1 bit input audio signal SA to the 64×fs/1 bit ΣΔ re-modulated signal SC.

At this time, a sum signal SX resulting from addition by the adder 159 of the amplitude controller output SK obtained by setting the coefficient of the coefficient generator 122 in the amplitude controller 104 to 1 and the amplitude controller output SV obtained by setting the coefficient of the coefficient generator 124 in the amplitude controller 110 to 0 is entered to the ΣΔ modulator 151.

The switching controller 154 then causes transition of the coefficient generator output SJ1 of the coefficient generator 122 in the amplitude controller 104 from 1 to 0 and transition of the coefficient generator output SJ2 of the coefficient generator 124 in the amplitude controller 110 from 0 to 1.

At a point after the outputs of the amplitude controller 104 and the amplitude controller 110 become 0 and 1 (maximum amplitude level) by the cross-fading, respectively, the subtraction value detection timing generator 155 in the switching controller 154 generates a subtraction value detection timing signal. Responsive to this subtraction value detection timing signal, the subtraction value control gate 166 takes in an addition surplus value subtraction value Sβ from the subtractor 165.

This addition surplus value subtraction value Sβ is hereinafter explained. The first integrator 153 in the ΣΔ modulator 151 outputs an integrated value Sα shown in FIG. 18. If the maximum amplitude level width is 1000 (binary) as a power of 2, and the lower 3 bits are detected and recognized as being a two's complement, this detection value directly is the sum surplus value subtraction result Sβ obtained on subtracting the positive maximum amplitude level from the surplus value for the maximum amplitude level width of a sum of the positive maximum amplitude levels.

The sum surplus value subtraction result Sβ is obtained on adding the positive maximum amplitude level by the adder 163 to the integrated value Sα outputted by the first integrator 153, detecting the surplus value with respect to the maximum amplitude level width of the sum output by the surplus value detector 164 and on subtracting the maximum amplitude level from the surplus value by the subtractor 165. This sum surplus value subtraction result Sβ is the lower three bits of the integrated value Sα.

Responsive to this subtraction value detection timing signal, the subtraction value control gate 166 takes in a surplus value Sβ and gradually subtracts the signal Sβ from the sum signal SX by the subtractor 160.

After pattern coincidence processing following delay of a pre-set number of samples, the switching controller 154 controls switching from the 64×fs/1 bit ΣΔ modulator output SC to the 64×fs/1 bit interpolated signal SB'.

The operation of the cross-fading switching processing unit 14 for several illustrative examples of the amplitude control output adjustment unit has been explained. The ΣΔ modulator may be provided with an integrator having a limiter or with an integrator having a feedback loop.

Referring to FIGS. 19 to 23, a preferred embodiment of the digital signal recording device according to the present invention is explained, which is a 1-bit audio signal recording device for taking in the 64×fs/1 bit audio switching signal SD, outputted by the output terminal 16 of the 1-bit audio signal switching device shown in FIG. 1, via an input terminal 41, and for halving the sampling frequency of 64×fs of the 64×fs/1 bit interpolated audio signal SB' for recording with a one-half recording rate of 32×fs during the period the 64×fs/1 bit audio switching signal SD derived from the output terminal 16 of the 1-bit audio signal SB' is selected. During the period of the 64×fs/1 bit audio switching signal SD when the 64×fs/1 bit interpolated audio signal SB' is selected, the signal SB' is not thinned out but directly recorded at a recording rate corresponding to 64×fs.

Figure 19:
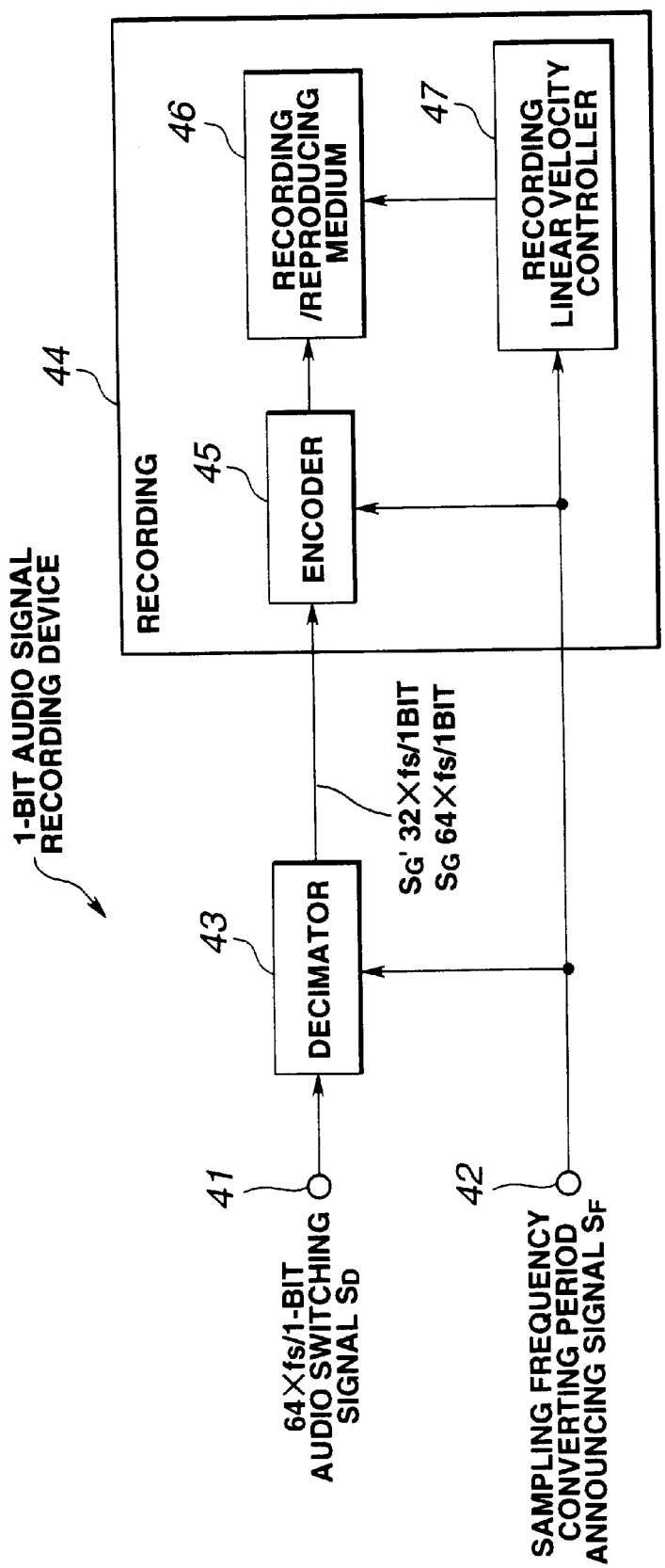
FIG. 19 shows a 1-bit audio signal recording device embodying the present invention.

Referring to FIG. 19, the 1-bit audio signal recording device includes a decimating unit 43 for decimating only the 64×fs/1 bit interpolated audio signal SB' of the 64×fs/1 bit audio switching signal SD and for allowing passage of the 64×fs/1 bit input audio signal SA unaltered and a recorder 44 for recording the sampling frequency conversion period announcing signal SF supplied from the input terminal 42 and the 32×fs/1 bit audio signal SG' or the 64×fs/1 bit audio signal SG from the decimating unit 43 on a recording/reproducing medium 46, such as a magnetic tape or optical disc, via encoder 45.

Since the 64×fs/1 bit interpolated audio signal SB' is a signal obtained on repeating a sample of the 32×fs/1 bit input audio signal SB twice on end, the decimator 43 can decimate one of the two samples in order to output 32×fs/1 bit audio signal SG'.

The recorder 44 includes the encoder 45 for encoding the 32×fs/1 bit audio signal SG' or the 64×fs/1 bit audio signal SG and the sampling frequency conversion period announcing signal SF and a recording/reproducing medium recording linear velocity controller 47 for controlling the linear recording velocity of recording data from the encoder 45 to the recording/reproducing medium.

The operation of the 1-bit audio signal recording device is explained by referring to FIGS. 20A to 20C. When the sampling frequency conversion period announcing signal SF supplied from the input terminal 42 advises the decimator 43 of the sampling frequency conversion period in the 64×fs/1 bit audio switching signal SD supplied from the input terminal 41, the decimator 43 decimates one of two samples of the same data occurring in succession, that is 64×fs/1 bit interpolated audio signal SB' switched with cross-fading by the 1-bit audio switching device, in order to output 32×fs/1 bit audio signal SG'.

Figures 21A, 21B, 21C:
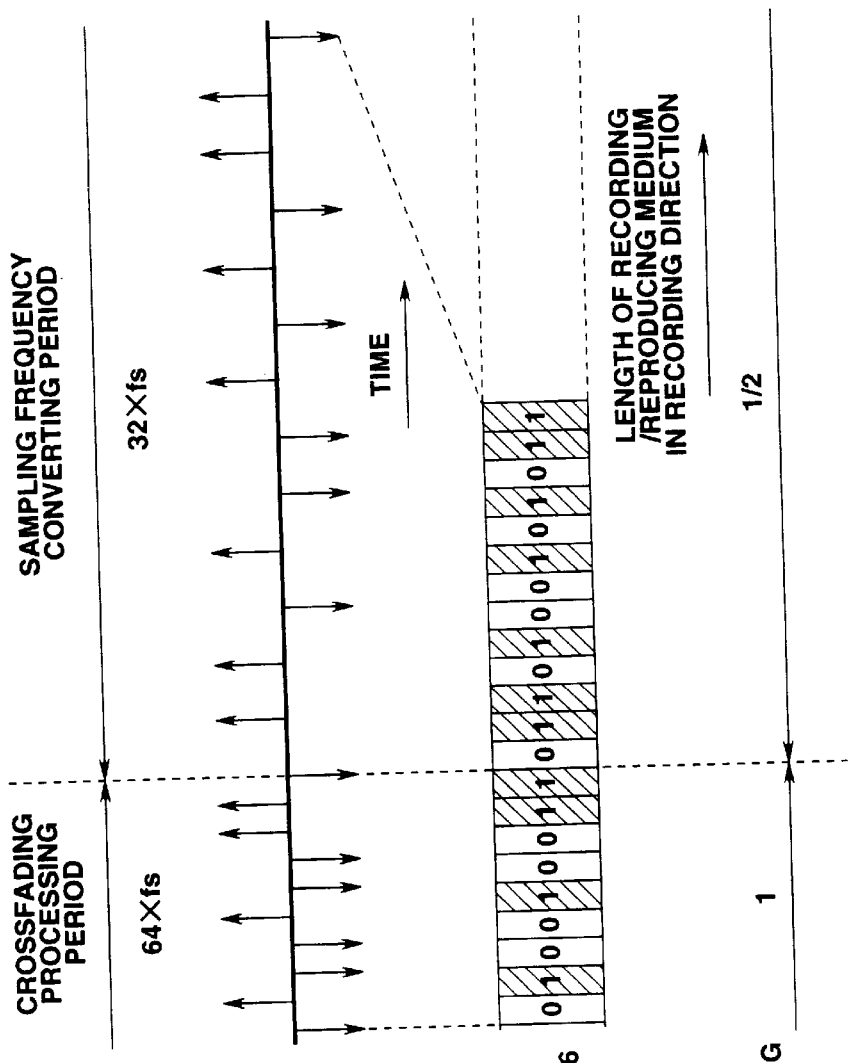
FIG. 21A is a timing chart showing a downsampled 1-bit audio signal SG' shown in FIG. 19.
FIG. 21B shows data for recording on a recording/reproducing medium 46 in FIG. 19.
FIG. 21C shows changes in the recording linear velocity of a recording medium of FIG. 19 at a switching timing.

If the signal supplied from the decimator 43 is the abovementioned 32×fs/1 bit audio signal SG', the recorder 44 records the recording data via the encoder 45 at one-half the recording rate on the recording/reproducing medium 46. Also, the recorder 44 controls the linear recording velocity for the recording/reproducing medium during the sampling frequency conversion period advised by the sampling frequency conversion period announcing signal SF, with the aid of a recording/reproducing medium recording linear velocity controller 47, to one half, as shown in FIG. 21C.

Thus, the recording consumption volume of the recording data on the recording/reproducing medium 46 for the 32×fs/1 bit audio signal SG' is equal to one-half that for the 64×fs/1 bit audio signal SG, as shown in FIG. 21, thus assuring a constant data recording density in the recording/reproducing medium 46.

When recording the recording data on the 32×fs/1 bit audio signal SG' by the encoder 45 on the recording/reproducing medium 46, the recorder 44 records the sampling frequency conversion period announcing signal SF announcing the above-mentioned sampling frequency announcing period. When recoding the recording data on the recording/reproducing medium, the encoder 45 adds a synchronization signal, an error correction parity signal and sub-code data in terms of a pre-set size of data as a unit for recording on the block basis. To the end, the sampling frequency conversion period announcing signal SF is recorded in a sub-data area shown in FIGS. 22 and 23 as the sampling frequency conversion period announcing information.

Figure 22:
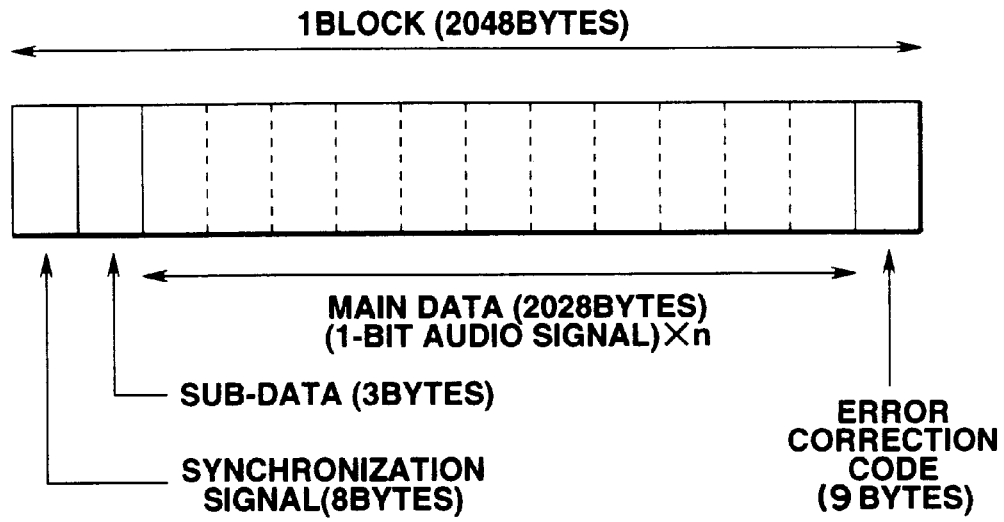
FIG. 22 shows a data structure of a block of recorded data.
Figure 23:
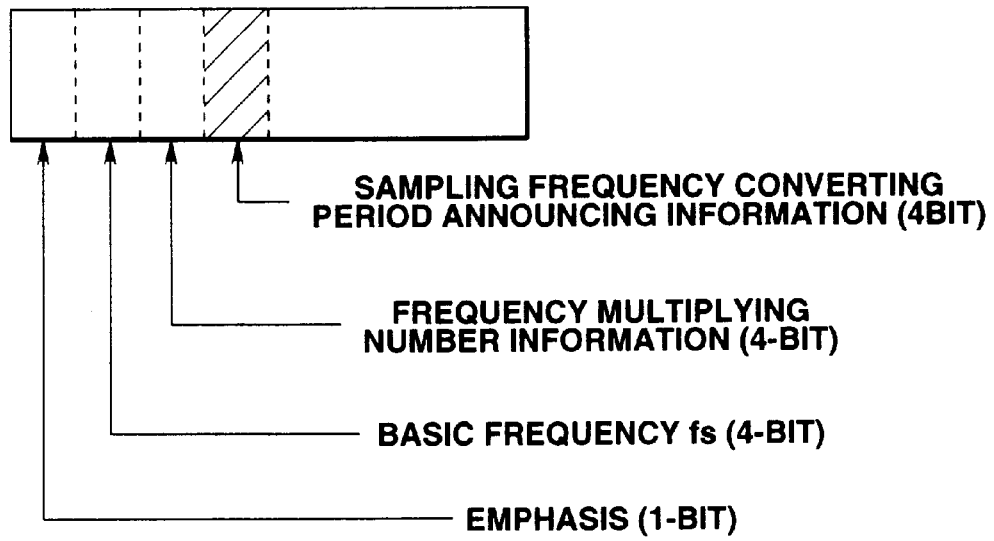
FIG. 23 shows a data structure of sub-data.

Specifically, the encoder 45 generates, on the block bases, a string of digital data made up of 8 bytes of synchronization signals, 3 bytes of sub-data, 2028 bytes of main data and 9 bytes of error correction signals, as shown in FIG. 22, such that it suffices to record the 4-bit sampling frequency conversion period announcing information along with the 4-bit frequency multiplying number information, 4-bit basic frequency, 1-bit emphasis and 11-bit ancillary data, as shown in FIG. 23.

That is, the encoder 45 encodes the 32×fs/1 bit audio signal SG' and the above-mentioned sampling frequency conversion period announcing information or the 64×fs/1 bit audio signal SG into block data shown in FIG. 22 for recording on the recording/reproducing medium 46.

If the recording/reproducing medium is a disc and the number of the sampling frequency switching points is limited for a disc, such points may be pre-recorded as the track information.

Figure 24:
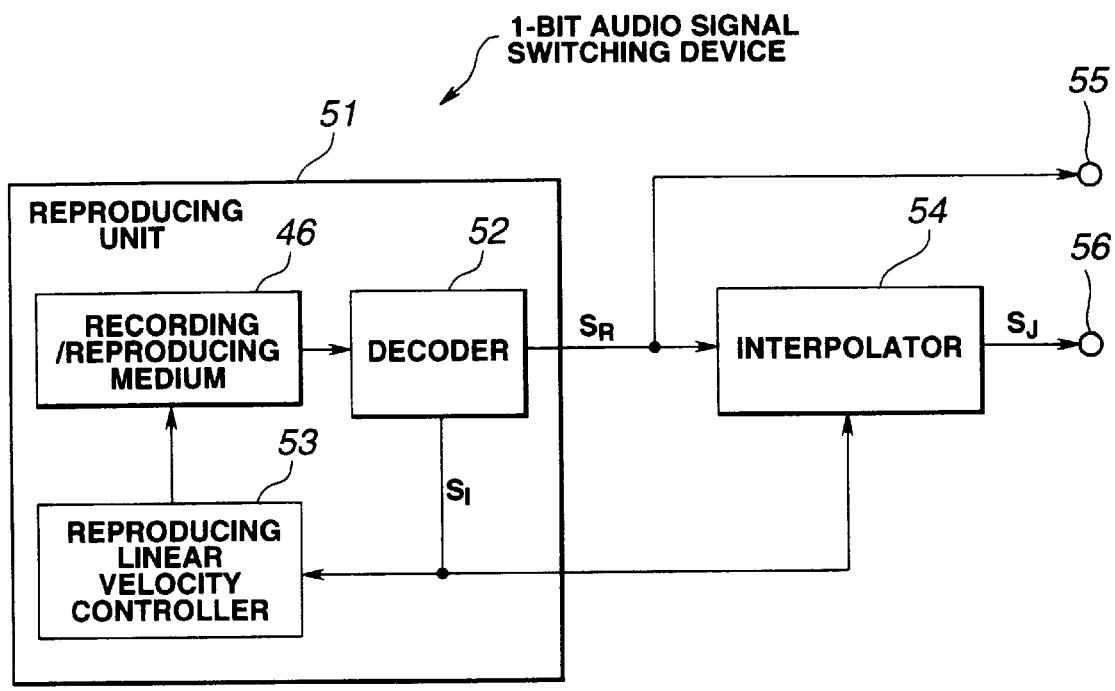
FIG. 24 shows a 1-bit audio signal reproducing device embodying the present invention.

Referring to FIG. 24, a preferred embodiment of the digital signal reproducing device according to the present invention is explained. The present embodiment is directed to a 1-bit audio signal reproducing device for reproducing a multi-rate/1 bit playback audio signal SR or a 64×fs/1 bit playback audio signal SJ shown in FIGS. 25A to 25E from the recording/reproducing medium 46 having the 32×fs/1 bit audio signal SG and the sampling frequency conversion period announcing information or the 64×fs/1 bit audio signal SG recorded thereon by the 1-bit audio signal recording device shown in FIG. 19. The multi-rate/1 bit output audio signal SR is a 1-bit audio signal having both the 64×fs/1 bit output audio signal and the 32×fs/1 bit audio signal.

This 1-bit audio signal reproducing device includes a reproducing unit 51 for reproducing the multi-rate/1 bit playback signal SR from the recording/reproducing medium 46, and an interpolating unit 54 for processing the 32×fs/1 bit output audio signal contained in the multi-rate/1 bit playback signal SR from the reproducing unit 51 with pre-value holding for outputting the 64×fs/1 bit output audio signals at an output terminal 56.

The reproducing unit 51 has a decoder 52 for decoding the playback data read from the recording/reproducing medium 46 and a recording/reproducing medium playback linear speed controller 53 for controlling the linear reproducing velocity during data reproduction from the recording/reproducing medium 46.

The interpolator 54 processes the 32×fs/1 bit playback audio signal contained in the multi-rate/1 bit playback signal SR with the above-mentioned pre-value holding for outputting the 64×fs/1 bit playback audio signal SJ at output terminal 56. Meanwhile, the multi-rate/1 bit playback audio signal SR may also be derived at an output terminal 55.

The operation of the 1-bit audio signal reproducing device is explained by referring to FIGS. 25A to 25E. The decoder 52 decodes the multi-rate/1 bit playback signal SR and the multi-bit playback audio signal SR and the sampling frequency conversion period announcing signal SI from the block data obtained from the recording/reproducing medium 46. When the recording/reproducing medium playback linear speed controller 53 receiving the sampling frequency conversion period announcing signal SI comprehends that the 32×fs/1 bit audio signal has been selected, the controller 53 controls the playback linear velocity to one-half of 64×fs. Thus permits the decoder 52 to decode the multi-rate/1 bit playback audio signal SR.

On reception of the sampling frequency conversion period announcing signal SI, the interpolator 54 processes the data of the 32×fs/1 bit playback signal period contained in the multi-bit playback audio signal SR with pre-value holding for outputting the 64×fs/1 bit playback audio signal SJ at the output terminal 56.

If the output signal obtained from the output terminal 56 d is converted by the playback D/A converter into analog audio signals, one can hear the sound similar to that produced if the 64×fs/1 bit playback audio signal SJ is perpetually entered.

It is seen from above that the present 1-bit audio signal reproducing device can smoothly switch from the 64×fs/1 bit audio signal to the 32×fs/1 bit audio signal.

What is claimed is:

1. A digital signal processing device for switching between a first 1-bit digital signal sampled at a first sampling frequency and a second 1-bit digital signal sampled at a second sampling frequency lower than said first sampling frequency, said digital signal processing device comprising:

conversion means for converting said second 1-bit digital signal sampled at the second sampling frequency into a third 1-bit digital signal sampled at said first sampling frequency and for outputting said third 1-bit digital signal;

switching means for switching between the third 1-bit digital signal outputted by the conversion means and the first 1-bit digital signal; and output means for outputting the first 1-bit digital signal and the third 1-bit digital signal sampled at the first sampling frequency from said switching means.

2. The digital signal processing device as set forth in claim 1, wherein said conversion means includes means for pre-value holding the second 1-bit digital signal sampled at the second sampling frequency with said first sampling frequency for generating the third 1-bit digital signal.

3. The digital signal processing device as set forth in claim 1, wherein said switching means includes means for switching between the first 1-bit digital signal and the third 1-bit digital signal outputted by said conversion means by crossfading.

4. The digital signal processing device as set forth in claim 1, wherein said switching means includes means for outputting an announcing signal announcing a switching period from the third 1-bit digital signal to the first 1-bit digital signal.

5. A digital signal processing device for switching between a first 1-bit digital signal sampled at a first sampling frequency and a second 1-bit digital signal sampled at a second sampling frequency lower than said first sampling frequency at a pre-set timing, said digital signal processing device comprising:

conversion means for converting said second 1-bit digital signal sampled at the second sampling frequency into a third 1-bit digital signal sampled at said first sampling frequency;

first bit length conversion means for converting the first 1-bit digital signal into a first multi-bit digital signal;

second bit length conversion means for converting the third 1-bit digital signal into a second multi-bit digital signal;

first amplitude control means for amplitude controlling the first multi-bit digital signal converted by the first bit length conversion means;

second amplitude control means for amplitude controlling the second multi-bit digital signal converted by the second bit length conversion means;

summing means for summing the first multi-bit digital signal controlled in an amplitude direction by said first amplitude control means and the second multi-bit digital signal controlled in the amplitude direction by said second amplitude control means;

re-quantization means for re-sampling a third multi-bit digital signal outputted by said summation means at the first sampling frequency;

pattern coincidence detection means for detecting a pattern coincidence between one of a 1-bit digital signal quantized by said re-quantization means and the first 1-bit digital signal and a pattern coincidence between the 1-bit digital signal quantized by said re-quantization means and the third 1-bit digital signal; and switching means for switching between the first 1-bit digital signal, the third 1-bit digital signal and the 1-bit digital signal quantized by the re-quantization means at a pre-set timing based on a detection by said pattern coincidence detection means.

6. The digital signal processing device as set forth in claim 5, further comprising:

level difference detection means for detecting a level difference between one of the first multi-bit digital signal converted by the first bit length conversion means and the second multi-bit digital signal converted by the second bit length conversion means and one of the first multi-bit digital signal controlled in the amplitude direction by the first amplitude control means and the second multi-bit digital signal controlled in the amplitude direction by the second amplitude control means;

cumulative summation means for cumulatively summing the level difference between one of said first multi-bit digital signal and said second multi-bit digital signal outputted by said first amplitude control means and said second amplitude control means, respectively, and not detected by said level difference detection means and the level difference detected by the level difference detection means; and subtraction means for generating a subtraction value control gate output signal based on a cumulation sum by said cumulative summation means and for subtracting the subtraction value control gate output signal from a sum obtained by said summing means of the first multi-bit digital signal controlled in the amplitude direction by said first amplitude control means and the second multi-bit signal controlled in the amplitude direction by said second amplitude control means.

7. The digital signal processing device as set forth in claim 6, wherein said subtraction value control gate output signal is generated based on an integrated output of a plurality of integrators constituting a plurality of $\Sigma\Delta$ modulator re-quantizing multi-bit digital signals outputted by the subtraction means into a 1-bit digital signal for subtraction by said subtraction means.

8. A digital signal recording device for recording a 1-bit digital signal on a recording medium, wherein said 1-bit digital signal is one of a first 1-bit digital signal sampled at a first sampling frequency and a third 1-bit digital signal obtained on interpolating by said first sampling frequency a second 1-bit digital signal sampled by a second sampling frequency lower than said first sampling frequency and wherein one of said first 1-bit digital signal and said third 1-bit digital signal is switched at a preset timing for transmission, said digital signal recording device comprising:

detection means for detecting said third 1-bit digital signal;

decimating means for decimating said third 1-bit digital signal during a time said third 1-bit digital signal is detected by said detection means; and recording means for recording data of a modulator on the recording medium, wherein said third 1-bit digital signal is outputted via said decimating means and the first 1-bit digital signal is fed to the modulator without interposition of said decimating means.

9. The digital signal recording device as set forth in claim 8, further comprising:

recording velocity control means for controlling a transfer velocity of said recording medium when an input digital signal is switched from the first 1-bit digital signal to the third 1-bit digital signal.

10. A digital signal reproducing device for reproducing a recording medium having recorded thereon a first 1-bit digital signal sampled at a first sampling frequency and a second 1-bit digital signal sampled at a second sampling frequency lower than said first sampling frequency, comprising:

demodulation means for demodulating a digital signal reproduced from the recording medium;

extraction means for extracting the second 1-bit digital signal sampled at the second sampling frequency from the digital signal reproduced from the recording medium;

means for pre-value holding the second 1-bit digital signal extracted by said extraction means based on said first sampling frequency for conversion to a third 1-bit digital signal of the first sampling frequency; and output means for outputting the first 1-bit digital signal without interposition of conversion means and for converting the second 1-bit digital signal and for outputting the converted second 1-bit digital signal.

* * * * *